(12) United States Patent
Sasaki et al.

(10) Patent No.: US 9,564,609 B2
(45) Date of Patent: Feb. 7, 2017

(54) LIGHT-EMITTING ELEMENT INCLUDING ELECTRODE OF THREE LAYERS

(75) Inventors: Toshiki Sasaki, Kanagawa (JP); Nozomu Sugisawa, Kanagawa (JP); Hisao Ikeda, Kanagawa (JP); Satoshi Seo, Kanagawa (JP); Nobuharu Ohsawa, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/369,797

(22) Filed: Feb. 9, 2012

(65) Prior Publication Data

US 2012/0205701 A1    Aug. 16, 2012

(30) Foreign Application Priority Data

Feb. 11, 2011    (JP) .................................. 2011-027958

(51) Int. Cl.
| | | |
|---|---|---|
| *H01L 33/00* | (2010.01) | |
| *H01L 51/52* | (2006.01) | |
| *H01L 51/50* | (2006.01) | |

(52) U.S. Cl.
CPC ....... *H01L 51/5218* (2013.01); *H01L 51/5036* (2013.01); *H01L 51/5265* (2013.01)

(58) Field of Classification Search
CPC .. H01L 51/5206; H01L 33/48; H01L 27/3248; H01L 51/5215; H01L 51/5231
USPC ...... 257/40, 94; 313/504, 506, 512; 438/597
See application file for complete search history.

(56) References Cited

U.S. PATENT DOCUMENTS

| | | |
|---|---|---|
| 5,404,075 A | 4/1995 | Fujikawa et al. |
| 5,554,911 A | 9/1996 | Nakayama et al. |
| 5,989,737 A | 11/1999 | Xie et al. |
| 6,013,384 A | 1/2000 | Kido et al. |
| 6,380,687 B1 | 4/2002 | Yamazaki |
| 6,423,429 B2 | 7/2002 | Kido et al. |
| 6,483,236 B1 | 11/2002 | Hung |
| 6,486,601 B1 | 11/2002 | Sakai et al. |

(Continued)

FOREIGN PATENT DOCUMENTS

| | | |
|---|---|---|
| CN | 001434669 A | 8/2003 |
| CN | 001808722 A | 7/2006 |

(Continued)

OTHER PUBLICATIONS

Chang et al, Electrode type reflector and transflective liquid crystal display, Google Translation of TW 200532341, Mar. 23, 2004.*

(Continued)

*Primary Examiner* — Mohsen Ahmadi
*Assistant Examiner* — Ismail Muse
(74) *Attorney, Agent, or Firm* — Husch Blackwell LLP

(57) ABSTRACT

A light-emitting element disclosed includes a first electrode layer; a second electrode layer which transmits light; and a light-emitting layer interposed between the first electrode layer and the second electrode layer. The first electrode layer includes a first conductive layer which is able to reflect light, a second conductive layer provided over the first conductive layer and including titanium, and a third conductive layer which transmits light and contains a metal oxide having work function higher than that of a material of the first conductive layer.

29 Claims, 10 Drawing Sheets

(56) References Cited

U.S. PATENT DOCUMENTS

| | | | |
|---|---|---|---|
| 6,489,638 B2 | 12/2002 | Seo et al. | |
| 6,518,700 B1 | 2/2003 | Friend et al. | |
| 6,552,496 B2 | 4/2003 | Yamazaki | |
| 6,559,594 B2 | 5/2003 | Fukunaga et al. | |
| 6,573,650 B2 | 6/2003 | Aoki et al. | |
| 6,589,673 B1 | 7/2003 | Kido et al. | |
| 6,642,544 B1 | 11/2003 | Hamada et al. | |
| 6,650,047 B2 | 11/2003 | Aoki et al. | |
| 6,774,573 B2 | 8/2004 | Yamazaki | |
| 6,794,278 B2 | 9/2004 | Kido et al. | |
| 6,830,494 B1 | 12/2004 | Yamazaki et al. | |
| 6,831,408 B2 | 12/2004 | Hirano et al. | |
| 6,993,214 B2 | 1/2006 | Nishimura et al. | |
| 7,074,500 B2 | 7/2006 | Pfeiffer et al. | |
| 7,126,269 B2 | 10/2006 | Yamada | |
| 7,199,516 B2 | 4/2007 | Seo et al. | |
| 7,276,297 B2 | 10/2007 | Lee et al. | |
| 7,321,196 B2 | 1/2008 | Cheng et al. | |
| 7,323,225 B2 | 1/2008 | Aoki et al. | |
| 7,374,828 B2 | 5/2008 | Kondakova et al. | |
| 7,399,991 B2 | 7/2008 | Seo et al. | |
| 7,417,261 B2 | 8/2008 | Seo et al. | |
| 7,482,182 B2 | 1/2009 | Yamazaki et al. | |
| 7,548,019 B2 | 6/2009 | Omura et al. | |
| 7,649,197 B2* | 1/2010 | Iwaki et al. | 257/40 |
| 7,663,149 B2 | 2/2010 | Seo et al. | |
| 7,687,986 B2 | 3/2010 | Nakayama | |
| 7,728,513 B2 | 6/2010 | Seo et al. | |
| 7,786,496 B2 | 8/2010 | Yamazaki et al. | |
| 8,004,183 B2 | 8/2011 | Seo et al. | |
| 8,339,031 B2 | 12/2012 | Tchakarov et al. | |
| 8,344,363 B2 | 1/2013 | Yamazaki et al. | |
| 8,362,688 B2 | 1/2013 | Noda | |
| 8,450,925 B2 | 5/2013 | Seo et al. | |
| 8,624,235 B2 | 1/2014 | Yamazaki et al. | |
| 8,747,178 B2 | 6/2014 | Seo et al. | |
| 8,748,876 B2 | 6/2014 | Sasaki et al. | |
| 8,785,919 B2 | 7/2014 | Yamazaki et al. | |
| 8,937,429 B2 | 1/2015 | Seo et al. | |
| 9,000,429 B2 | 4/2015 | Yamazaki et al. | |
| 9,165,987 B2 | 10/2015 | Yamazaki et al. | |
| 9,362,534 B2 | 6/2016 | Yamazaki et al. | |
| 2001/0004190 A1 | 6/2001 | Nishi et al. | |
| 2001/0025959 A1 | 10/2001 | Yamazaki et al. | |
| 2001/0041270 A1 | 11/2001 | Maruyama et al. | |
| 2001/0043046 A1 | 11/2001 | Fukunaga | |
| 2001/0046611 A1 | 11/2001 | Kido et al. | |
| 2001/0053559 A1 | 12/2001 | Nagao et al. | |
| 2002/0093290 A1 | 7/2002 | Yamazaki | |
| 2003/0020520 A1* | 1/2003 | Miyake | G09G 3/20 327/112 |
| 2003/0089905 A1* | 5/2003 | Udagawa et al. | 257/40 |
| 2003/0111666 A1 | 6/2003 | Nishi et al. | |
| 2003/0171060 A1 | 9/2003 | Hirano et al. | |
| 2003/0189401 A1 | 10/2003 | Kido et al. | |
| 2003/0214246 A1 | 11/2003 | Yamazaki | |
| 2004/0140758 A1 | 7/2004 | Raychaudhuri et al. | |
| 2004/0152392 A1* | 8/2004 | Nakamura | 445/25 |
| 2004/0160154 A1 | 8/2004 | Nishimura et al. | |
| 2005/0006667 A1 | 1/2005 | Yamazaki | |
| 2005/0035708 A1 | 2/2005 | Yamazaki et al. | |
| 2005/0062039 A1* | 3/2005 | Kim | 257/40 |
| 2005/0084712 A1 | 4/2005 | Kido et al. | |
| 2005/0084713 A1 | 4/2005 | Kido et al. | |
| 2005/0098207 A1 | 5/2005 | Matsumoto et al. | |
| 2005/0106419 A1 | 5/2005 | Endoh et al. | |
| 2005/0170208 A1 | 8/2005 | Yatsunami et al. | |
| 2005/0224789 A1 | 10/2005 | Seo et al. | |
| 2005/0236981 A1* | 10/2005 | Cok et al. | 313/504 |
| 2005/0248267 A1 | 11/2005 | Gyoutoku et al. | |
| 2005/0250308 A1* | 11/2005 | Yamaguchi et al. | 438/618 |
| 2006/0008740 A1 | 1/2006 | Kido et al. | |
| 2006/0091397 A1 | 5/2006 | Akimoto et al. | |
| 2006/0134462 A1* | 6/2006 | Yeh et al. | 428/690 |
| 2006/0180812 A1 | 8/2006 | Sakata et al. | |
| 2006/0186804 A1 | 8/2006 | Sakakura et al. | |
| 2006/0232203 A1* | 10/2006 | Noda | 313/506 |
| 2006/0263638 A1 | 11/2006 | Kawakami et al. | |
| 2006/0290380 A1 | 12/2006 | Miyake et al. | |
| 2007/0080630 A1 | 4/2007 | Egawa et al. | |
| 2007/0096613 A1* | 5/2007 | Shin | H01L 51/5218 313/112 |
| 2007/0200125 A1 | 8/2007 | Ikeda et al. | |
| 2007/0205411 A1 | 9/2007 | Itai | |
| 2008/0042550 A1* | 2/2008 | Matsuura et al. | 313/498 |
| 2008/0116458 A1* | 5/2008 | Yamauchi | G09G 3/32 257/59 |
| 2008/0206967 A1* | 8/2008 | Miyairi | H01L 21/0237 438/479 |
| 2008/0230835 A1* | 9/2008 | Shingu | H01L 29/41733 257/347 |
| 2009/0058274 A1* | 3/2009 | Yokoyama et al. | 313/504 |
| 2009/0085474 A1 | 4/2009 | Shitagaki et al. | |
| 2009/0098704 A1* | 4/2009 | Ohnuma | H01L 21/76254 438/406 |
| 2009/0102366 A1* | 4/2009 | Ushikubo et al. | 313/504 |
| 2009/0108254 A1 | 4/2009 | Lee et al. | |
| 2009/0114926 A1* | 5/2009 | Yamazaki | G09G 3/3208 257/79 |
| 2009/0160323 A1* | 6/2009 | Nomura | C07D 209/86 313/504 |
| 2009/0167160 A1* | 7/2009 | Song et al. | 313/504 |
| 2009/0224245 A1* | 9/2009 | Umezaki | H01L 27/1255 257/59 |
| 2010/0038639 A1* | 2/2010 | Akimoto | H01L 29/41733 257/43 |
| 2010/0072884 A1 | 3/2010 | Tchakarov et al. | |
| 2010/0123152 A1* | 5/2010 | Sugisawa et al. | 257/98 |
| 2010/0181904 A1 | 7/2010 | Yoshizaki et al. | |
| 2010/0187977 A1* | 7/2010 | Kai et al. | 313/504 |
| 2010/0225227 A1 | 9/2010 | Tchakarov et al. | |
| 2010/0270544 A1* | 10/2010 | Yamauchi | 257/40 |
| 2010/0301368 A1 | 12/2010 | Im et al. | |
| 2012/0206675 A1 | 8/2012 | Seo et al. | |
| 2013/0119379 A1 | 5/2013 | Noda | |
| 2013/0168651 A1 | 7/2013 | Tchakarov et al. | |

FOREIGN PATENT DOCUMENTS

| | | |
|---|---|---|
| CN | 101399319 A | 4/2009 |
| CN | 101536608 A | 9/2009 |
| CN | 100583493 C | 1/2010 |
| CN | 101853924 A | 10/2010 |
| EP | 0 855 848 A2 | 7/1998 |
| EP | 0 948 063 A2 | 10/1999 |
| EP | 1 009 198 A1 | 6/2000 |
| EP | 1 065 723 A2 | 1/2001 |
| EP | 1 089 361 A2 | 4/2001 |
| EP | 1 093 167 A2 | 4/2001 |
| EP | 1 128 438 A1 | 8/2001 |
| EP | 1 160 891 A2 | 12/2001 |
| EP | 1 261 042 A1 | 11/2002 |
| EP | 1 331 667 A2 | 7/2003 |
| EP | 1 351 558 A1 | 10/2003 |
| EP | 1 424 732 A2 | 6/2004 |
| EP | 1 524 706 A2 | 4/2005 |
| EP | 1 524 707 A2 | 4/2005 |
| EP | 1 530 245 A2 | 5/2005 |
| EP | 2 045 847 A2 | 4/2009 |
| JP | 1-312873 A | 12/1989 |
| JP | 2-139892 A | 5/1990 |
| JP | 3-114197 A | 5/1991 |
| JP | 3-190088 A | 8/1991 |
| JP | 3-274695 A | 12/1991 |
| JP | 4-357694 A | 12/1992 |
| JP | 5-182766 A | 7/1993 |
| JP | 6-267658 A | 9/1994 |
| JP | 6-275381 | 9/1994 |
| JP | 6-290873 A | 10/1994 |
| JP | 7-312289 A | 11/1995 |
| JP | 9-63771 A | 3/1997 |
| JP | 10-255985 A | 9/1998 |
| JP | 10-270171 A | 10/1998 |

(56) References Cited

FOREIGN PATENT DOCUMENTS

| | | |
|---|---|---|
| JP | 10-308284 A | 11/1998 |
| JP | 2824411 | 11/1998 |
| JP | 11-251067 A | 9/1999 |
| JP | 11-297474 A | 10/1999 |
| JP | 11-307259 A | 11/1999 |
| JP | 11-307264 A | 11/1999 |
| JP | 2000-223276 A | 8/2000 |
| JP | 2000-315580 A | 11/2000 |
| JP | 2000-315581 A | 11/2000 |
| JP | 2001-43980 | 2/2001 |
| JP | 2001-76868 A | 3/2001 |
| JP | 2001-185354 A | 7/2001 |
| JP | 2001-244079 A | 9/2001 |
| JP | 2002-15873 A | 1/2002 |
| JP | 2002-324673 | 11/2002 |
| JP | 2002-332567 A | 11/2002 |
| JP | 2002-367784 A | 12/2002 |
| JP | 2003-109775 | 4/2003 |
| JP | 2003-229278 A | 8/2003 |
| JP | 2003-272860 A | 9/2003 |
| JP | 2004-006332 A | 1/2004 |
| JP | 2004-134395 A | 4/2004 |
| JP | 2004-514257 A | 5/2004 |
| JP | 2004-178930 A | 6/2004 |
| JP | 2004-349007 A | 12/2004 |
| JP | 2005-26121 A | 1/2005 |
| JP | 2005-32618 A | 2/2005 |
| JP | 2005-123094 A | 5/2005 |
| JP | 2005-123095 A | 5/2005 |
| JP | 2005-166637 A | 6/2005 |
| JP | 2005-251587 A | 9/2005 |
| JP | 2005-302696 A | 10/2005 |
| JP | 2006-32327 | 2/2006 |
| JP | 2006-156369 A | 6/2006 |
| JP | 2008-122941 | 5/2008 |
| JP | 2010-153365 | 7/2010 |
| JP | 2010-192413 | 9/2010 |
| JP | 2010-278010 | 12/2010 |
| WO | WO 00/01203 A1 | 1/2000 |
| WO | WO 02/41414 A1 | 5/2002 |
| WO | WO 2005/006460 A1 | 1/2005 |
| WO | WO 2007/129874 A1 | 11/2007 |

OTHER PUBLICATIONS

Search Report re European application No. EP 12155048.7, dated May 25, 2012.

Nakada, T. et al., "Multi Photon Emission Organic EL Devices Using Charge-Transfer Complex as Charge Generation Layer," 63rd Applied Physics-Related Combined Seminar Seminar Proceedings, Sep. 24, 2002, p. 1165 (with English translation).

Tokito, S. et al., "Metal Oxides as a Hole-Injecting Layer for an Organic Electroluminescent Device," Journal of Physics D: Applied Physics, 1996, vol. 29, pp. 2750-2753.

Chinese Office Action re Application No. CN 201210029202.X, dated Jun. 2, 2015.

Chinese Office Action re Application No. CN 201210029202.X, dated Jan. 5, 2016.

* cited by examiner

FIG. 1A
FIG. 1B
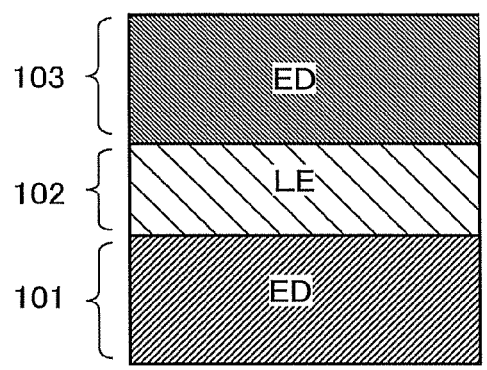
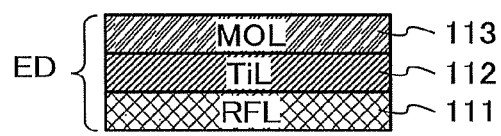

LIGHT-EMITTING ELEMENT INCLUDING ELECTRODE OF THREE LAYERS

BACKGROUND OF THE INVENTION

1. Field of the Invention

The present invention relates to a light-emitting element. The present invention relates to a display device including the light-emitting element in a pixel portion. The present invention further relates to a lighting device including the light-emitting element in a light-emitting portion.

2. Description of the Related Art

In recent years, a light-emitting element which is one of the electro-optical elements and contains an organic compound or an inorganic compound which emits light by applying voltage or current (the light-emitting element is also referred to as an electroluminescent element or an EL element) has been developed.

The light-emitting element includes at least a first electrode, a second electrode, and a light-emitting layer overlapping with the first electrode and the second electrode and emits light in accordance with voltage applied between the first electrode and the second electrode.

For example, the light-emitting element can be manufactured in such a manner that a first electrode is formed, a light-emitting layer is formed over the first electrode, and a second electrode is formed over the light-emitting layer. One of the first electrode and the second electrode from which light is not extracted is preferably formed using a material having high reflectivity. As a material having high reflectivity, aluminum can be given, for example (e.g., Patent Document 1).

REFERENCE

[Patent Document 1] Japanese Published Patent Application No. 2010-192413

SUMMARY OF THE INVENTION

A conventional light-emitting element does not have sufficient element characteristics and needs further improvement in element characteristics.

In order to improve element characteristics, driving voltage needs to be lower, for example. For example, a reduction in voltage loss, due to an electrode, an improvement in charge injection characteristics of an electrode, or the like can lower the driving voltage.

In one embodiment of the present invention, an object is to reduce driving voltage of a light-emitting element with the purpose of improving characteristics of a light-emitting element.

In one embodiment of the present invention, an electrode of a light-emitting element is formed of a stack of a first conductive layer reflecting light, a second conductive layer containing titanium, and a third conductive layer transmitting light and containing a metal oxide with work function higher than that of a material of the first conductive layer, whereby voltage loss due to the electrode is reduced and the charge injection characteristics of the electrode is improved; therefore, the driving voltage of a light-emitting element is reduced.

Further, in one embodiment of the present invention, a light-emitting element has a structure in which light emitted from a light-emitting layer is intensified by interference. For example, the third conductive layer is formed using a light-transmitting material at a controlled thickness so that light of a light-emitting element can be intensified. In such a manner, it can be achieved not only to reduce the driving voltage of a light-emitting element but also to increase the intensity of light of the light-emitting element, so that the element characteristics of a light-emitting element can be improved.

In one embodiment of the present invention, the light-emitting element is applied to a display device or a lighting device, so that the power consumption of the display device or the lighting device is reduced.

In one embodiment of the present invention, voltage loss due to an electrode can be reduced or the charge injection characteristics of an electrode can be improved, so that driving voltage can be reduced and the element characteristics of a light-emitting element can be improved.

BRIEF DESCRIPTION OF THE DRAWINGS

FIGS. 1A and 1B illustrate an example of a light-emitting element in Embodiment 1.

DETAILED DESCRIPTION OF THE INVENTION

Figure 2A:
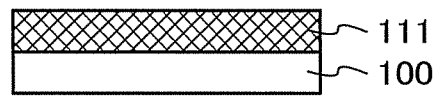
FIGS. 2A to 2E illustrate an example of a method for manufacturing a light-emitting element in Embodiment 1.

Examples of embodiments of the present invention will be described with reference to the drawings below. Note that it will be readily appreciated by those skilled in the art that details of the embodiments can be modified in various ways without departing from the spirit and scope of the present invention. The present invention is therefore not limited to the following description of the embodiments.

Note that the contents in different embodiments can be combined with one another as appropriate. In addition, the contents in different embodiments can be interchanged one another.

Further, the ordinal numbers such as "first" and "second" are used to avoid confusion between components and do not limit the number of components.

Embodiment 1

In this embodiment, an example of a light-emitting element will be described.

A structural example of a light-emitting element in this embodiment will be described with reference to FIGS. 1A and 1B. FIGS. 1A and 1B illustrate the structural example of the light-emitting element in this embodiment.

The light-emitting element includes, as shown in FIG. 1A, an electrode layer (also referred to as ED) 101, a light-emitting layer (also referred to as LE) 102, and an electrode layer 103.

Note that an electrode layer is a layer functioning as an electrode.

The electrode layer 101 functions as an electrode of the light-emitting element.

The light-emitting layer 102 emits light with a particular color by application of voltage. The light-emitting layer 102 includes M (M is a natural number) light-emitting units.

Voltage generally refers to a difference between potentials at two points (also referred to as a potential difference). However, values of both a voltage and a potential are represented using volt (V) in a circuit diagram or the like in some cases, so that it is difficult to distinguish between them. Thus, a potential difference between a potential at one point and a potential to be a reference (also referred to as the reference potential) is used as a voltage at the point in some cases.

The electrode layer 103 functions as an electrode of the light-emitting element.

The light-emitting element illustrated in FIG. 1A includes a pair of electrodes (the electrode layer 101 and the electrode layer 103) and a light-emitting layer (the light-emitting layer 102) overlapping the pair of electrodes. The light-emitting layer 102 emits light in accordance with voltage applied between the pair of electrodes, so that the light-emitting element emits light.

Components of the light-emitting element will be described below.

One of the electrode layer 101 and the electrode layer 103 (also referred to as a first electrode layer) includes a conductive layer 111 (also referred to as RFL), a conductive layer 112 (also referred to as TiL), and a conductive layer 113 (also referred to as MOL), as illustrated in FIG. 1B.

The conductive layer 111 can be a metal layer of a material reflecting light. The layer of a material reflecting light can be a layer of aluminum, or a layer of a metal alloy of aluminum and another metal (one or more of titanium, neodymium, nickel, and lanthanum), for example. Aluminum has low resistance and high light reflectance. Aluminum is included in earth's crust in large amount and is inexpensive; therefore, using aluminum reduces costs for manufacturing a light-emitting element. Alternatively, silver can be used.

The conductive layer 112 can be a conductive layer containing titanium such as a titanium layer and a titanium oxide layer. Note that the conductive layer 112 may be a mixed layer of titanium oxide and a conductive titanium compound. The conductive layer 112 is provided over the conductive layer 111, so that oxidation or electrolytic corrosion of the conductive layer 111 can be prevented.

Further, heat treatment is preferably performed on the conductive layer 112. The heat treatment improves adherence between the conductive layer 112 and the conductive layer 113.

The conductive layer 113 is provided between the conductive layer 112 and the light-emitting layer 102. The conductive layer 113 can be a layer of a metal oxide with high conductivity and work function which is higher than that of a material of the conductive layer 111. Further, the conductive layer 113 has a light-transmitting property. The conductive layer 113 can be a layer of a metal oxide such as indium oxide ($In_2O_3$), tin oxide ($SnO_2$), zinc oxide (ZnO), indium oxide-tin oxide ($In_2O_3$—$SnO_2$, which is also referred to as ITO), indium oxide-tin oxide including silicon oxide (also referred to as ITO—SiOx), indium oxide-zinc oxide ($In_2O_3$—ZnO); the aforementioned metal oxide including silicon, silicon oxide, or nitrogen; or the like. Further, the conductive layer 113 can be formed of a stack of the aforementioned materials. The above materials are preferable because a reduction in element characteristics can be suppressed even in the case where the conductive layer 113 is in contact with the conductive layer 112 and the light-emitting layer 102.

The light-emitting layer 102 can be formed of a layer containing a light-emitting material such as a fluorescent material or a phosphorescent material.

The other of the electrode layer 101 and the electrode layer 103 (also referred to as a second electrode layer) transmits light. The second electrode layer can be a layer of a metal oxide such as indium oxide, tin oxide, zinc oxide, indium oxide-tin oxide, indium oxide-tin oxide including silicon oxide, indium oxide-zinc oxide; the aforementioned metal oxide including silicon, silicon oxide, or nitrogen; or the like. Further, a layer of silver, a layer of magnesium, or a layer of an alloy of silver and magnesium can be used as the second electrode layer. Moreover, the second electrode layer can be formed of a stack of the aforementioned materials.

When the light-emitting element has a structure in which light is emitted through the electrode layer 103, the electrode layer 101 is a stack of the conductive layer 111, the conductive layer 112, and the conductive layer 113; and the electrode layer 103 is a light-transmitting conductive layer. When the light-emitting element has a structure in which light is emitted through the electrode layer 101, the electrode layer 103 is a stack of the conductive layer 111, the conductive layer 112, and the conductive layer 113; and the electrode layer 101 is a light-transmitting conductive layer.

The light-emitting element may have a structure in which light emitted from the light-emitting layer 102 is intensified by interference between the first electrode layer and the second electrode layer. In other words, the optical path lengths is adjusted so that the light emitted from the light-emitting layer 102 is intensified by interference between the first electrode layer and the second electrode layer. For example, the length between the electrode layer 101 and the electrode layer 103 may be adjusted so that the product of the length between the electrode layer 101 and the electrode layer 103, that is the thickness of the light-emitting layer 102, and the refractive index of the light-emitting layer 102 becomes N/2 (N is a natural number) times of the wavelength of desired light. Further, in the case where the conductive layer 113 is able to transmit light, the length between the conductive layer 111 and the electrode layer 103 may be adjusted so that the product of the length between the conductive layer 111 and the electrode layer 103 and the refractive index of the light-emitting layer 102 becomes N2 (N is a natural number) times of the wavelength of desired light. In this manner, the intensity of light of the light-emitting element can be improved. The adjusted structure is also referred to as an optically resonant structure or a microcavity structure.

Note that in the case where the conductive layer 113 transmits light, the optical path length is preferably adjusted by adjustment of the thickness of the conductive layer 113. This is because the conductive layer 113 transmits light and can be formed by a photolithography technique, and therefore, a manufacturing process is simple and the thickness can easily be adjusted.

The above is a description of the structural example of the light-emitting element, which is illustrated in FIGS. 1A and 1B.

As described with reference to FIGS. 1A and 1B, in the example of the light-emitting element in this embodiment, the first electrode layer is formed of a stack of a first conductive layer reflecting light, a second conductive layer containing titanium, and a third conductive layer transmitting light and containing a metal oxide with work function higher than that of a material of the first conductive layer, so that voltage loss due to the electrode can be reduced and the charge injection characteristics of the electrode is improved. Therefore, the driving voltage of a light-emitting element can be reduced.

Further, in one embodiment of the present invention, the optically resonant structure can be controlled by changing the thickness of the conductive layer including a metal oxide, which can reflect light and can be formed by a photolithography technique. The adjustment improves the intensity of light of the light-emitting element.

Thus, the element characteristics of the light-emitting element can be improved.

The example of the method for manufacturing the light-emitting element in this embodiment will be described with reference to FIGS. 2A to 2E. Note that FIGS. 2A to 2E illustrate the example of the light-emitting element with a structure in which light is extracted from the electrode layer 103 side.

First, as illustrated in FIG. 2A, the conductive layer 111 is formed over the element formation layer 100.

For example, a conductive film which can be used as the conductive layer 111 is formed by sputtering, whereby the conductive layer 111 can be formed.

Figure 2B:
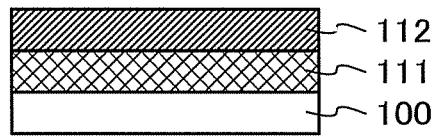

Next, as illustrated in FIG. 2B, the conductive layer 112 is formed over the conductive layer 111.

For example, a conductive film which can be used as the conductive layer 112 is formed by sputtering, whereby the conductive layer 112 can be formed.

Furthermore, heat treatment is performed. For example, a heat treatment is performed at 200° C. or higher and 300° C. or lower. The above heat treatment can oxidize part of the conductive layer 112.

Figure 2C:
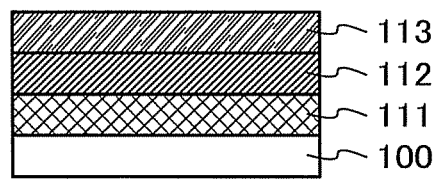

Next, as illustrated in FIG. 2C, the conductive layer 113 is formed over the conductive layer 112.

For example, a conductive film which can be used as the conductive layer 113 is formed by sputtering, whereby the conductive layer 113 can be formed.

Figure 2D:
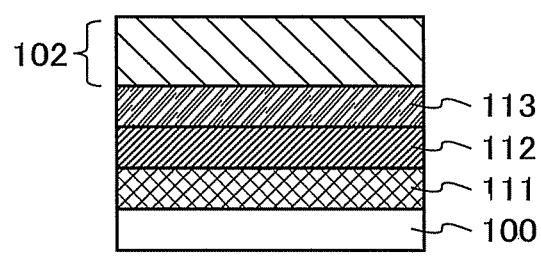

Next, as illustrated in FIG. 2D, the light-emitting layer 102 is formed over the conductive layer 113.

For example, a film of a material which can be used for the light-emitting layer 102 is formed by an evaporation method (including a vacuum evaporation method), an inkjet method, a coating method, or the like, whereby the light-emitting layer 102 can be formed.

Figure 2E:
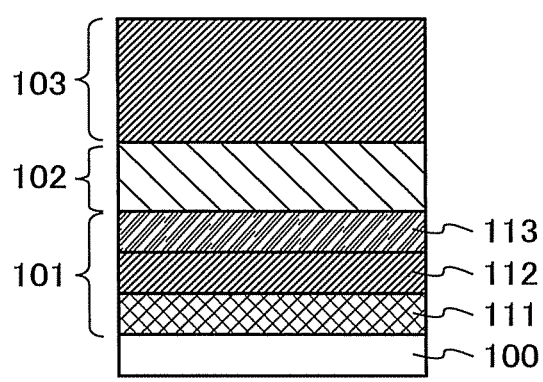

Then, as illustrated in FIG. 2E, the electrode layer 103 is formed over the light-emitting layer 102.

For example, a conductive film which can be used as the electrode layer 103 is formed by sputtering, whereby the electrode layer 103 can be formed.

The above is the description of the example of the method for manufacturing the light-emitting element.

As described with reference to FIGS. 2A to 2E, in an example of manufacturing a light-emitting element in this embodiment, a first conductive layer reflecting light and a second conductive layer containing titanium are sequentially formed and then subjected to heat treatment; after that, a third conductive layer containing a metal oxide with work function higher than that of the first conductive layer is formed over the second conductive layer to formed an electrode layer. By the above manufacturing method, generation of stress due to oxygen vacancies in the third conductive layer can be prevented. Therefore, adhesion between the second conductive layer and the third conductive layer can be improved.

Embodiment 2

In this embodiment, structural examples of a light-emitting layer (LE) of the light-emitting element in the above embodiment will be described.

The light-emitting layer includes M light-emitting units (also referred to as LEU).

The structural examples of the light-emitting unit in this embodiment will be described with reference to FIGS. 3A to 3D. FIGS. 3A to 3D are schematic cross-sectional views each illustrate the structural example of the light-emitting unit in this embodiment.

Figure 3A:
FIGS. 3A to 3D are schematic cross-sectional views illustrating structural examples of a light-emitting layer in Embodiment 2.

A light-emitting unit illustrated in FIG. 3A includes an electroluminescence layer (also referred to as ELL) 121a.

The electroluminescence layer 121a includes a light-emitting material.

Figure 3B:
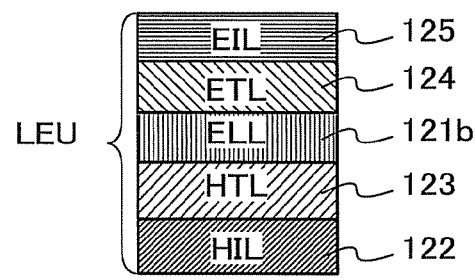

A light-emitting unit illustrated in FIG. 3B includes the electroluminescence layer 121b, a hole-injection layer (also referred to as HIL) 122, a hole-transport layer (also referred to as HTL) 123, an electron-transport layer (also referred to as ETL) 124, and an electron-injection layer (also referred to as EIL) 125.

The electroluminescence layer 121b includes a light-emitting material.

The electroluminescence layer 121b is provided over the hole-transport layer 123. In the case where the hole-transport layer 123 is not provided, the electroluminescence layer 121b is provided over the hole-injection layer 122.

The hole-injection layer 122 is a layer for injecting holes. Note that the hole-injection layer 122 is not necessarily provided.

In the case where the hole-injection layer 122 is provided, the hole-transport layer 123 is provided over the hole-injection layer 122.

The hole-transport layer 123 is a layer for transporting holes to the electroluminescence layer 121b. Note that the hole-transport layer 123 is not necessarily provided.

The electron-transport layer 124 is provided over the electroluminescence layer 121b.

The electron-transport layer 124 is a layer for transporting electrons to the electroluminescence layer 121b. Note that the electron-transport layer 124 is not necessarily provided.

In the case where the electron-transport layer 124 is provided, the electron-injection layer 125 is provided over the electron-transport layer 124. Note that in the case where the electron-transport layer 124 is not provided, the electron-injection layer 125 is provided over the electroluminescence layer 121b.

The electron-injection layer 125 is a layer for injecting electrons.

The components of the light emission units in FIGS. 3A and 3B will be described.

The electroluminescence layer 121a and the electroluminescence layer 121b can be, for example, a layer containing a host material and a fluorescent compound or a phosphorescent compound.

Examples of the fluorescent compound include a fluorescent material which emits blue light (also referred to as a blue fluorescent material), a fluorescent material which emits green light (also referred to as a green fluorescent material), a fluorescent material which emits yellow light (also referred to as a yellow fluorescent material), and a fluorescent material which emits red light (also referred to as a red fluorescent material).

Examples of the blue fluorescent material include N,N-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviated to PCBAPA).

Examples of the green fluorescent material include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA).

Examples of the yellow fluorescent material include rubrene and 5,12-bis(1,1'-biphenyl-4-yl)-6,11-diphenyltetracene (abbreviation: BPT).

Examples of the red fluorescent material include N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-a]fluoranthene-3,10-diamine (abbreviation: p-mPhAFD).

Examples of the phosphorescent compound include a phosphorescent material which emits blue light (blue phosphorescent material), a phosphorescent material which emits green light (green phosphorescent material), a phosphorescent material which emits yellow light (yellow phosphorescent material), a phosphorescent material which emits orange light (orange phosphorescent material), and a phosphorescent material which emits red light (red phosphorescent material).

Examples of the blue phosphorescent material include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis{2-[3',5'-bis(trifluoromethyl)phenyl]pyridinato-N,$C^{2'}$}iridium(III)picolinate (abbreviation: Ir(CF$_3$ppy)$_2$(pic)), and bis[2-(4',6'-difluorophenyl)pyridinato-N,$C^{2'}$]iridium(III)acetylacetonate (abbreviation: FIr(acac).

Examples of the green phosphorescent material include tris(2-phenylpyridinato-N,$C^{2'}$)iridium(III) (abbreviation: Ir(ppy)$_3$), bis[2-phenylpyridinato-N,$C^{2'}$]iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$).

Examples of the yellow phosphorescent material include bis(2,4-diphenyl-1,3-oxazolato-N,$C^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)).

Examples of the orange phosphorescent material include tris(2-phenylquinolinato-N,$C^{2'}$)iridium(III) (abbreviation: Ir(pq)$_3$), bis(2-phenylquinolinato-N,$C^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)).

Examples of the red phosphorescent material include bis[2-(2]-benzo[4,5-a]thienyl)pyridinato-N,$C^{3'}$)iridium(III) acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium (III) (abbreviation: Ir(tppr)$_2$(dpm)), and (2,3,7,8,12,13,17,18-octaethyl-21H,23H-porphine)platinum(II) (abbreviation: PtOEP).

A rare earth metal complex can be used as the phosphorescent compound. The rare earth metal complex emits light from a rare earth metal ion (electron transition between different multiplicities), and thus can be used as the phosphorescent compound. Examples of the phosphorescent compound that can be used include tris(acetylacetonato)(monophenanthroline)terbium(III) (abbreviation: Tb(acac)$_3$(Phen)), tris(1,3-diphenyl-1,3-propanedionato) (monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)).

In the electroluminescence layer 121a and the electroluminescence layer 121b, the fluorescent compound or the phosphorescent compound is dispersed, as a guest material, in the host material. A substance which has a higher lowest unoccupied molecular orbital level (LUMO level) than the guest material and has a lower highest occupied molecular orbital level (HOMO level) than the guest material is preferably used as the host material.

Examples of the host material include a metal complex, a heterocyclic compound, a condensed aromatic compound, and an aromatic amine compound.

Examples of the host material include tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_{12}$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ), 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), bathocuproine (abbreviation: BCP), CzPA, 3,6-diphenyl-9-[4-(10-phenyl-9-anthryl)phenyl]-9H-carbazole (abbreviation: DPCzPA), DNA, t-BuDNA, 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), DPAnth, 6,12-dimethoxy-5,11-diphenylchrysene, N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB, TPD, DFLDPBi, and BSPB.

The electroluminescence layer 121a and the electroluminescence layer 121b can be constituted by using a plurality of above materials.

The electroluminescence layer 121a and the electroluminescence layer 121b are each formed of a layer in which a guest material is dispersed in a host material, whereby the crystallization of the electroluminescence layer 121a and the electroluminescence layer 121b can be prevented and concentration quenching of the guest material can also be prevented.

Each of the electroluminescence layer 121a and the electroluminescence layer 121b can be a layer containing a light-emitting substance that is a high molecular compound.

Examples of the light-emitting substance that is a high molecular compound include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-buty 1-phenyl)-1,4-diaminobenzene]} (abbreviation: TAB-PFH), polyp-phenylenevinylene) (abbreviation: PPV), poly[(9,9-dihexylfluorene-2,7-diyl)-alt-co-(benzo[2,1,3] thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, and poly{[2-methoxy-5-(2-ethylhexyloxy)-1,4-bis (1-cyanovinylenephenylene)]-alt-co-[2,5-bis(N,N-diphenylamino)-1,4-phenylene]} (abbreviation: CN-PPV-DPD).

The hole-injection layer 122 can be a layer containing a substance having a hole-injection property.

Examples of the substance having a hole-injection property include molybdenum oxide, vanadium oxide, ruthenium oxide, tungsten oxide, and manganese oxide.

Other examples of the substance having a hole-injection property include phthalocyanine (abbreviation: H₂Pc) and a metal phthalocyanine such as copper phthalocyanine (abbreviation: CuPc).

Other examples of the substance having a hole-injection property include an aromatic amine such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[4N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples of the substance having a hole-injection property include an oligomer, a dendrimer, and a polymer. For example, poly(N-vinylcarbazole) (PVK), poly(4-vinyltriphenylamine) (PVTPA), poly[N-(4-{N'-[4-(4-diphenylamino)phenyl]phenyl-N'-phenylamino}phenyl)methacrylamide] (PTPDMA), poly[N,N'-bis(4-butylphenyl)-N,N-bis(phenyl)benzidine] (Poly-TPD), or the like can be used.

Other examples of the substance having a hole-injection property include a doped polymer such as poly(3,4-ethylenedioxythiophene)/poly(styrenesulfonic acid) (PEDOT/PSS) and polyaniline/poly(styrenesulfonic acid) (PAni/PSS).

A layer formed of a composite material containing an organic compound having a hole-transport property and an acceptor substance can be used as the hole-injection layer 122. In this case, the organic compound contained in the composite material preferably has a hole mobility of $10^{-6}$ cm$^2$/Vs or higher. The layer formed of the composite material containing a substance having a high hole-transport property and an acceptor substance is used as the hole-injection layer 122, whereby holes are easily injected from an electrode of a light-emitting element, which results in a reduction in the driving voltage of the light-emitting element. The layer formed of a composite material can be formed by, for example, co-evaporation of a substance having a high hole-transport property and an acceptor substance.

Examples of the organic compound contained in the composite material include an aromatic amine compound, a carbazole derivative, an aromatic hydrocarbon, and a high molecular compound (e.g., an oligomer, a dendrimer, or a polymer).

Other examples of the organic compound contained in the composite material include TDATA, MTDATA, DPAB, DNTPD, DPA3B, PCzPCA1, PCzPCA2, PCzPCN1,4,4'-bis [N-(1-naphthyl)-N-phenylamino]biphenyl (abbreviation: NPB or a-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Other examples of the organic compound contained in the composite material include 2-tert-butyl-9,10-di(2-naphthyl) anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di (2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples of the organic compound contained in the composite material include 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

As the acceptor substance that is an electron acceptor, an organic compound such as 7,7,8,8-tetracyano-2,3,5,6-tetra-fluoroquinodimethane (abbreviation: $F_4$-TCNQ) or chloranil, or a transition metal oxide can be used.

As the acceptor substance that is an electron acceptor, an oxide of a metal belonging to any of Groups 4 to 8 of the periodic table can also be used. For example, vanadium oxide, niobium oxide, tantalum oxide, chromium oxide, molybdenum oxide (MoOx), tungsten oxide, manganese oxide, and rhenium oxide are preferable as the acceptor substance that is an electron acceptor because of their high electron-accepting property. Molybdenum oxide is more preferable because it is stable in the air, has a low hygroscopic property, and is easily handled.

The hole-injection layer 122 can be, for example, a layer formed using a composite material of any of the above electron acceptors and a high molecular compound such as PVK, PVTPA, PTPDMA, or Poly-TPD.

The hole-transport layer 123 can be a layer containing a material with a hole-transport property.

An aromatic amine compound can be used as the substance having a hole-transport property.

Examples of the substance having a hole-transport property include NPB, TPD, 4,4',4"-tris(carbazol-9-yl)triphenylamine (abbreviation: TCTA), TDATA, MTDATA, 4,4'-bis[N-(spiro-9,9'-bifluoren-2-yl)-N-phenylamino]biphenyl (abbreviation: BSPB), PCzPCA1, PCzPCA2, and PCzPCN1.

The hole-transport layer 123 can be a layer containing a carbazole derivative such as CBP, TCPB, CzPA, or the like.

The hole-transport layer 123 can also be a layer containing a polymer such as PVK, PVTPA, PTPDMA, Poly-TPD, or the like.

The hole-transport layer 123 can be formed of a stack of the aforementioned materials.

The electron-transport layer 124 can be a layer containing a substance having an electron-transport property.

Examples of the substance having an electron-transport property include Alq, Almq$_3$, BeBq$_2$, BAlq, bis[2-(2-benzoxazolyl)phenolato]zinc(II) (Zn(BOX)$_2$), ZnBTZ, PBD, OXD-7,9-[4-(5-phenyl-1,3,4-oxadiazol-2-yl)phenyl]-9H-carbazole (CO11), TAZ, BPhen, BCP, poly[(9,9-dihexyl-fluorene-2,7-diyl)-co-(pyridine-3,5-diyl)] (PF-Py), and poly[(9,9-dioctylfluorene-2,7-diyl)-co-(2,2'-bipyridine-6,6'-diyl)] (PF-Bpy).

The electron-transport layer 124 can be formed of a stack of the aforementioned materials.

The electron-injection layer 125 can be a layer containing an alkali metal, an alkaline earth metal, a compound thereof, or the like. A layer formed using a material applicable to the electron-transport layer, in which an alkali metal, an alkaline earth metal, a compound thereof, or the like is contained, can also be used as the electron-injection layer 125.

The hole-injection layer 122, the hole-transport layer 123, the electroluminescence layer 121a, the electroluminescence layer 121b, the electron-transport layer 124, and the electron-injection layer 125 can be formed by a method such as an evaporation method (including a vacuum evaporation method), an inkjet method, or a coating method.

The above is the description of the structural example of the light-emitting unit.

Further, as a structural example of a light-emitting layer including a plurality of light-emitting units, structural examples of a light-emitting layer including two light-emitting units and a light-emitting layer including three light-emitting units will be described with reference to FIGS. 3C and 3D.

Figure 3C:
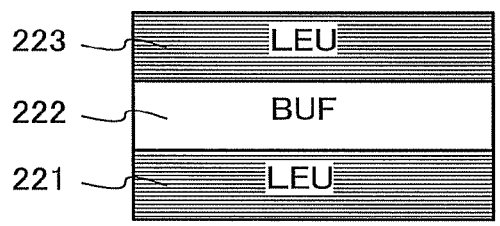

The light-emitting layer illustrated in FIG. 3C includes a light-emitting unit (LEU) 221, a charge generation layer (also referred to as BUF) 222, and a light-emitting unit 223.

Figure 3D:
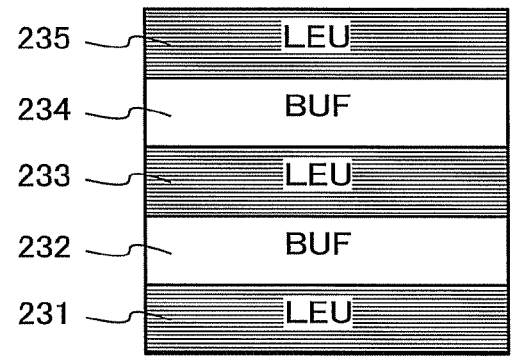

The light-emitting layer illustrated in FIG. 3D includes a light-emitting unit 231, a charge generation layer 232, a light-emitting unit 233, a charge generation layer 234, and a light-emitting unit 235.

A light-emitting unit with the structure described with reference to FIG. 3A or FIG. 3B can be used as appropriate as the light-emitting unit 221, the light-emitting unit 223, the light-emitting unit 231, the light-emitting unit 233, and the light-emitting unit 235.

Each of the charge generation layer 222, the charge generation layer 232, and the charge generation layer 234 can be a stack of an electron-injection buffer layer with a high electron-donating property and an electron-transport property and a composite material layer with a high hole-transport property.

The electron-injection buffer layer is a layer which reduces the barrier for electron injection into the light-emitting layer.

The electron-injection buffer layer can be a layer containing a material having an electron-injection property or an electron-donating property and a material having an electron-transport property.

Examples of the material having an electron-injection property or an electron-donating property include metal materials such as an alkali metal, an alkaline earth metal, and a rare earth metal, and a compound of the metal material.

Examples of the substance having an electron-transport property include a substance which has an electron transporting property higher than a hole transporting property. Exemplified are a metal complex such as Alq, Almq$_3$, BeBq$_2$, BAlq, Zn(BOX)$_2$, and Zn(BTZ)$_2$, an oxadiazole derivative such as PBD, OXD-7, and CO11, a triazole derivative such as TAZ, a phenanthroline derivative such as Bphen and BCP, and a polymer such as PF-Py and PF-BPy.

The composite material layer can be a layer including a composite material in which an acceptor substance is contained in the substance having a hole-transport property.

In that case, by providing a charge generation layer, the luminance of the light-emitting element can be improved while the current density of the light-emitting element is kept low, which results in an increase in the lifetime of the light-emitting element.

With a stack of light-emitting units which emit light of different colors, a variety of emission colors can be obtained and the luminance can be improved.

For example, when the light-emitting unit 221 emits blue light and the light-emitting unit 223 emits yellow light, the light-emitting layer illustrated in FIG. 3C can be a light-emitting layer emitting white light. Further, when the light-emitting unit 221 emits blue-green light and the light-emitting unit 223 emits red light, the light-emitting layer illustrated in FIG. 3C can be a light-emitting layer emitting white light. Note that this embodiment is not limited thereto and a plurality of light-emitting units may be selected to form a light-emitting layer emitting colored light other than white light.

A light-emitting unit which includes an electroluminescence layer containing a fluorescent material and emits blue light is used for the light-emitting unit 231, a light-emitting unit which includes an electroluminescence layer containing a phosphorescent material and emits orange light is used for the light-emitting unit 233, and a light-emitting unit which includes an electroluminescence layer containing a phosphorescent material and emits orange light is used for the light-emitting unit 235; thus, the light-emitting layer illustrated in FIG. 3D can be a light-emitting layer emitting white light. Note that this embodiment is not limited thereto and a plurality of light-emitting units may be selected to form a light-emitting layer emitting colored light other than white light.

Note that this embodiment is not limited thereto and a light-emitting layer may be formed using a plurality of light-emitting units emitting white light.

As described with reference to FIGS. 3A to 3D, the example of the light-emitting layer in this embodiment includes M light-emitting units.

In the example of the light-emitting layer in this embodiment, a plurality of light-emitting units are stacked, whereby emission efficiency can be higher; therefore, the element characteristics of the light-emitting element can be improved.

Embodiment 3

In this embodiment, an example of a display device provided with the light-emitting element in the above embodiment in a pixel portion will be described.

Figure 4:
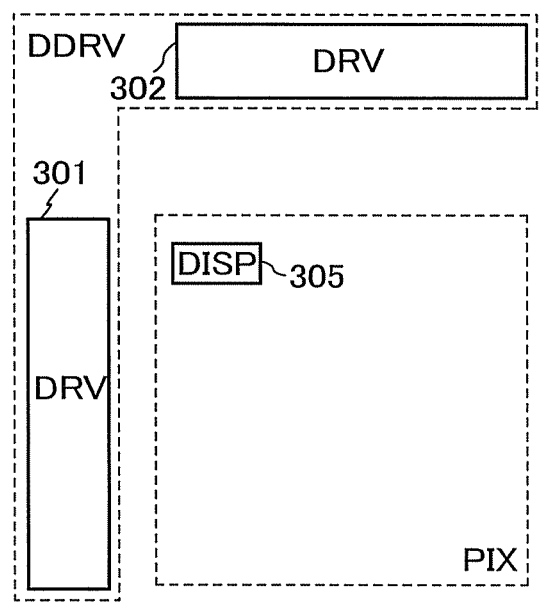
FIG. 4 is a block diagram illustrating a structural example of a display device in Embodiment 3.

First, an example of the display device in this embodiment will be described with reference to FIG. 4. FIG. 4 is a diagram for explaining the display device in this embodiment.

The display device illustrated in FIG. 4 includes a display driving portion DDRV and a pixel portion PIX.

The display driving portion DDRV controls display operation in the display device.

The pixel portion PIX performs the display operation.

The display device illustrated in FIG. 4 includes a driver circuit (also referred to as DRV) 301, a driver circuit 302, and a plurality of display circuits (also referred to as DISP) 305.

The driver circuit 301 is provided for or the display driving portion DDRV. The driver circuit 301 has a function of selecting the display circuit 305.

The driver circuit 301 has a shift register, for example. In that case, the driver circuit 301 can output a plurality of pulse signals from the shift register, and thus can output a signal for selecting the display circuit 305. Alternatively, the driver circuit 301 may have a plurality of shift registers. In that case, the driver circuit 301 can output a plurality of pulse signals from each of the plurality of shift registers, and thus can output a plurality of signals for controlling the display circuit 305.

The driver circuit 302 is provided for the display driving portion DDRV. An image signal is input to the driver circuit 302. The driver circuit 302 has a function of generating a plurality of display data signals that is a voltage signal on the basis of the input image signal and outputting the plurality of generated display data signals.

The driver circuit 302 includes a plurality of transistors, for example.

In the display device, the transistor has two terminals and a current control terminal that controls current flowing between the two terminals with an applied voltage. Note that without limitation to the transistor, in an element, terminals between which current flows and the current is controlled are also referred to as current terminals. Two current terminals are also referred to as a first current terminal and a second current terminal.

In the display device, a field-effect transistor can be used as a transistor, for example. In the case of a field-effect transistor, a first current terminal is one of a source and a drain, a second current terminal is the other of the source and the drain, and a current control terminal is a gate.

The driver circuit 302 can output data of video signals as a plurality of display data signals by selectively turning on or off a plurality of transistors. The plurality of transistors can be controlled by inputting a control signal that is a pulse signal to their gates.

The plurality of display circuits 305 are provided in the pixel portion PIX in rows and columns. Any one of a plurality of display data signals is input to each of the plurality of display circuits 305. Note that one pixel is formed using one or more display circuits 305.

Note that it is also possible to display a full-color image in the pixel portion by providing a display circuit emitting red light, a display circuit emitting green light, and a display circuit emitting blue light and by making these display circuits emit light. In addition to the above-described display circuits, one or more display circuits emitting light of one or more of the following colors: cyan, magenta, and yellow may be provided. By providing one or more display circuits emitting light of one or more of the following colors: cyan, magenta, and yellow, the kind of colors that can be represented in a displayed image can be increased, so that the quality of the displayed image can be improved. For example, a colored layer that transmits light with a particular wavelength of light emitted from a light-emitting element are provided in a display circuit, thereby achieving the emission of light of the particular color. This structure enables a full-color image to be displayed without forming a plurality of light emitting elements emitting light of different colors, thereby facilitating the manufacturing process, enhancing yield, and improving the quality and reliability of the light emitting elements.

Further, the example of the display circuit in this embodiment is described with reference to FIGS. 5A and 5B.

First, a configuration example of the display circuit in this embodiment is described with reference to FIG. 5A. FIG. 5A is a circuit diagram illustrating the configuration example of the display circuit in this embodiment.

Figure 5A:
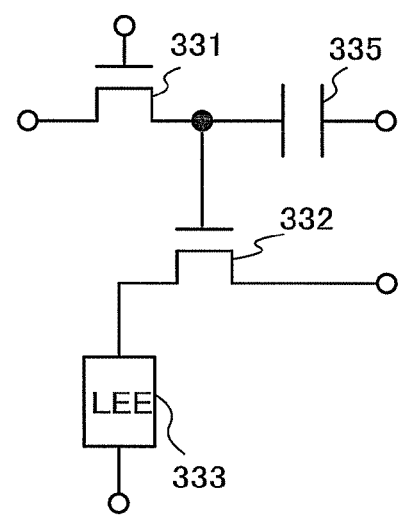
FIGS. 5A and 5B illustrate an example of a display circuit and a timing diagram for driving the display circuit, respectively.
Figure 5B:
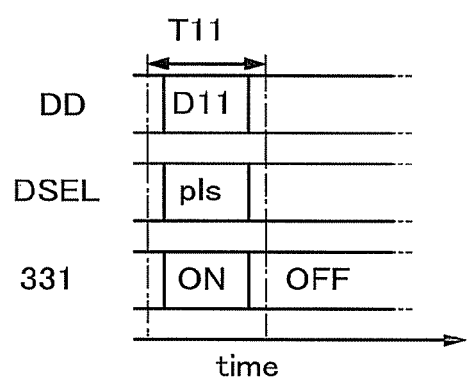

The display circuit illustrated in FIG. 5A includes a transistor 331, a transistor 332, a light-emitting element (also referred to as LEE) 333, and a capacitor 335.

Note that in the display circuit illustrated in FIG. 5A, the transistor 331 and the transistor 332 are field-effect transistors.

Note that, in the display circuit, the capacitor includes a first capacitor electrode, a second capacitor electrode, and a dielectric layer overlapping with the first capacitor electrode and the second capacitor electrode. The capacitor accumulates charge in accordance with a voltage applied between the first capacitor electrode and the second capacitor electrode.

A display data signal (also referred to as a signal DD) is input to one of a source and a drain of the transistor 331. A display selection signal (also referred to as a signal DSEL) is input to a gate of the transistor 331.

A voltage Vb is input to one of a source and a drain of the transistor 332. A gate of the transistor 332 is electrically connected to the other of the source and the drain of the transistor 331.

A first electrode of the light-emitting element 333 is electrically connected to the other of the source and the drain of the transistor 332. A voltage Va is input to a second electrode of the light-emitting element 333.

The voltage Vc is input to a first capacitor electrode of the capacitor 335. A second capacitor electrode of the capacitor 335 is electrically connected to the gate of the transistor 332.

Note that one of the voltage Va and the voltage Vb is a high power supply voltage Vdd, and the other is a low power supply voltage Vss. The absolute value of a difference between the voltage Va and the voltage Vb is preferably larger than at least the absolute value of the threshold voltage of the transistor 332. The voltage Va and the voltage Vb may interchange depending, for example, on the conductivity type of the transistor. The voltage Vc is set as appropriate.

The components of the display circuit illustrated in FIG. 5A will be described.

The transistor 331 is a signal-input selection transistor. Note that a signal-input selection signal is input from the driver circuit 301 illustrated in FIG. 4.

The transistor 332 is a driving transistor for controlling the amount of current flowing to the light-emitting element 333.

The capacitor 335 is a storage capacitor holding charge, the amount of which is determined by a display data signal. Note that the capacitor 335 is not necessarily provided.

Note that each of the transistors 331 and 332 can be, for example, a transistor having a semiconductor layer containing a semiconductor that belongs to Group 14 in the periodic table (e.g., silicon) or an oxide semiconductor layer in which a channel is formed. The transistor including the oxide semiconductor layer has an off-state current lower than that of a conventional transistor including a semiconductor layer (e.g., a silicon layer). The oxide semiconductor layer has a wider band gap than silicon and is an intrinsic (i-type) or substantially intrinsic semiconductor layer. The off-state current per micrometer of channel width of the transistor having an oxide semiconductor layer is lower than or equal to 10 aA ($1\times10^{-17}$ A), preferably lower than or equal to 1 aA ($1\times10^{-18}$ A), more preferably lower than or equal to 10 zA ($1\times10^{-20}$ A), more preferably lower than or equal to 1 zA ($1\times10^{-21}$ A), more preferably lower than or equal to 100 yA ($1\times10^{-22}$ A).

Next, an example of a method for driving the display circuit illustrated in FIG. 5A will be described with reference to FIG. 5B. FIG. 5B is a timing diagram for explaining the example of the method for driving the display circuit illustrated in FIG. 5A, and illustrates the states of a signal DD, a signal DSEL, and the transistor 331.

In the example of the method for driving the display circuit in FIG. 5A, in the period T11, there is an input of the pulse (also referred to as pls) of the signal DSEL, so that the transistor 331 is in the on state (also referred to as the state ON).

When the transistor 331 is in the on state, the signal DD is input to the display circuit, so that the voltage of the gate of the transistor 332 and the voltage of the second capacitor electrode of the capacitor 335 each become the same as the voltage of the signal DD (e.g., a voltage D11 here).

At this time, current flows between the source and the drain of the transistor 332 in accordance with the voltage of the gate of the transistor 332, and current flows between the first and second electrodes of the light emitting element 333, so that the light emitting element 333 emits light. At this time, the voltage of the first electrode of the light emitting element 333 depends on the voltage of the signal DD and the luminance of the light emitting element 333 becomes a value determined by the voltage Va and the voltage of the first electrode set in accordance with the signal DD.

Further, after the input of the pulse of the signal DSEL ends, the transistor 331 switches to the off state (also called the state OFF).

The above is the description of the example of the method for driving the display circuit illustrated in FIG. 5A.

A structural example of a display device in this embodiment will be described. Note that as an example, the display circuit has a circuit configuration illustrated in FIG. 5A.

A display device in this embodiment includes a first substrate (also referred to as an active matrix substrate) where a semiconductor element such as a transistor is provided, a second substrate, and a light-emitting element provided between the first substrate and the second substrate.

Figure 6A:
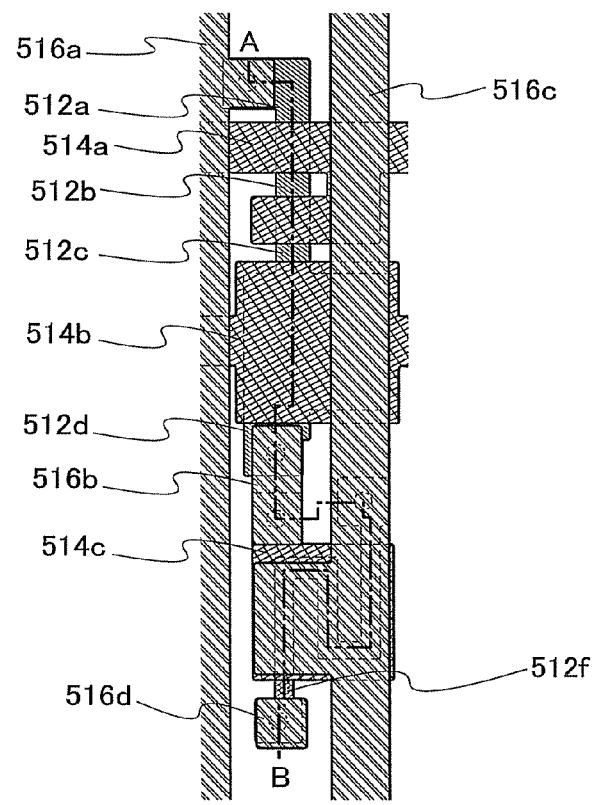
FIGS. 6A and 6B illustrate a structural example of an active matrix substrate.
Figure 6B:
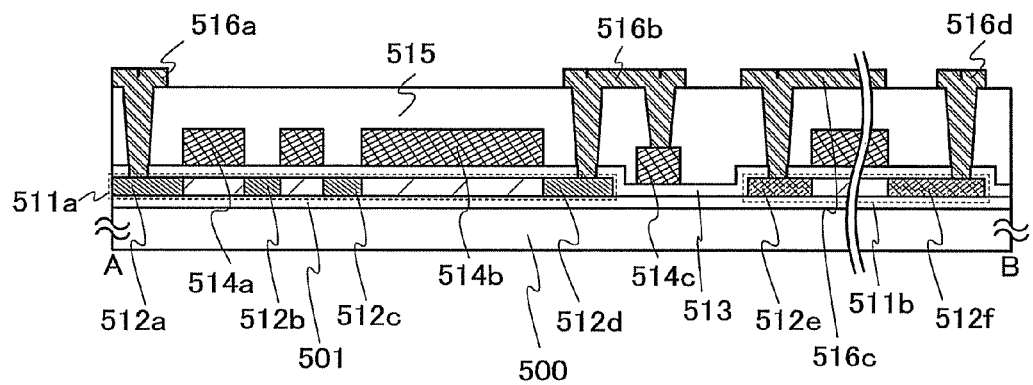

A structural example of the active matrix substrate in the display device in this embodiment is described with reference to FIGS. 6A and 6B. FIGS. 6A and 6B illustrate the structural example of the active matrix substrate in the display device in this embodiment. FIG. 6A is a schematic plan view and FIG. 6B is a schematic cross-sectional view taken along line A-B in FIG. 6A. Note that the components illustrated in FIGS. 6A and 6B include those having sizes different from the actual sizes. In addition, for convenience, part of a cross section taken along line A-B in FIG. 6A is omitted in FIG. 6B.

The active matrix substrate illustrated in FIGS. 6A and 6B includes a substrate 500, an insulating layer 501, semiconductor layers 511a and 511b, an insulating layer 513, conductive layers 514a to 514c, an insulating layer 515, and conductive layers 516a to 516d.

The semiconductor layers 511a and 511b are each provided over the substrate 500 with the insulating layer 501 provided therebetween.

The semiconductor layer 511a includes impurity regions 512a to 512d containing an impurity element imparting a p-type conductivity or an n-type conductivity. The semiconductor layer 511a functions as a layer in which the channel of a signal-input-selection transistor in the display circuit is formed (also referred to as a channel formation layer) and as the second capacitor electrode of the storage capacitor in the display circuit.

Note that in the semiconductor layer 511a, a channel formation region of a signal-input selection transistor in the display circuit is provided between the impurity region 512a and the impurity region 512b and between the impurity region 512b and the impurity region 512c.

The semiconductor layer 511b includes an impurity region 512e and an impurity region 512f containing an impurity element imparting a p-type conductivity or an n-type conductivity. The semiconductor layer 511b functions as a channel formation layer of a driving transistor of the display circuit.

Note that in the semiconductor layer 511b, a channel formation region of the driving transistor in the display circuit is provided between the impurity region 512e and the impurity region 512f.

The insulating layer 513 is provided over the semiconductor layers 511a and 511b. The insulating layer 513 functions as gate insulating layers of the signal-input selection transistor and the driving transistor in the display circuit, and a dielectric layer of a storage capacitor in the display circuit.

The conductive layer 514a overlaps with part of the semiconductor layer 511a with the insulating layer 513 provided therebetween. Note that a region of the semiconductor layer 511a which overlaps with the conductive layer 514a is the channel formation region of the signal-inputselection transistor in the display circuit. The conductive layer 514a functions as the gate of the signal-input-selection transistor in the display circuit. Note that in FIGS. 6A and 6B, the conductive layer 514a overlaps with part of the semiconductor layer 511a at a plurality of portions. The conductive layer 514a does not necessarily overlap with part of the semiconductor layer 511a at a plurality of portions, but the switching characteristics of the signal-input-selection transistor in the display circuit can be improved when the conductive layer 514a overlaps with part of the semiconductor layer 511a at a plurality of portions. Note that a region of the semiconductor layer 511a which overlaps with the conductive layer 514a may contain an impurity element imparting p-type or n-type conductivity, the concentration of which is lower than that of the impurity element in the impurity regions 512a to 512d provided in the semiconductor layer 511a.

The conductive layer 514b overlaps over part of the semiconductor layer 511a with the insulating layer 513 provided therebetween. The conductive layer 514b functions as a first capacitor electrode of a storage capacitor in the display circuit. Note that a region of the semiconductor layer 511a which overlaps with the conductive layer 514a may contain an impurity element imparting a p-type or n-type conductivity, the concentration of which is lower than that of the impurity element in the impurity regions 512a to 512d. The conductive layer 514b functions as the first capacitor electrode of the storage capacitor and a capacitor line in the display circuit.

The conductive layer 514c overlaps with part of the semiconductor layer 511b with the insulating layer 513 provided therebetween. The conductive layer 514c functions as the gate of the driving transistor in the display circuit.

The insulating layer 515 is provided over the insulating layer 513 with the conductive layers 514a to 514c provided therebetween.

The conductive layer 516a is electrically connected to the impurity region 512a through a first opening formed in the insulating layer 513 and the insulating layer 515. The conductive layer 516a functions as a wiring to which one of the source and the drain of the signal-input-selection transistor in the display circuit and a wiring to which a display data signal is input.

The conductive layer 516b is electrically connected to the impurity region 512d through a second opening formed in the insulating layer 513 and the insulating layer 515 and to the conductive layer 514c through a third opening formed in the insulating layer 515. The conductive layer 516b functions as the other of the source and the drain of the signal-input-selection transistor in the display circuit.

The conductive layer 516c is electrically connected to the impurity region 512e through a fourth opening formed in the insulating layer 513 and the insulating layer 515. The conductive layer 516c functions as one of the source and the drain of the driving transistor in the display circuit and a power supply line to which the voltage Vb is input.

The conductive layer 516d is electrically connected to the impurity region 512f through a fifth opening formed in the insulating layer 513 and the insulating layer 515. The conductive layer 516d functions as the other of the source and the drain of the driving transistor in the display circuit.

Figure 7:
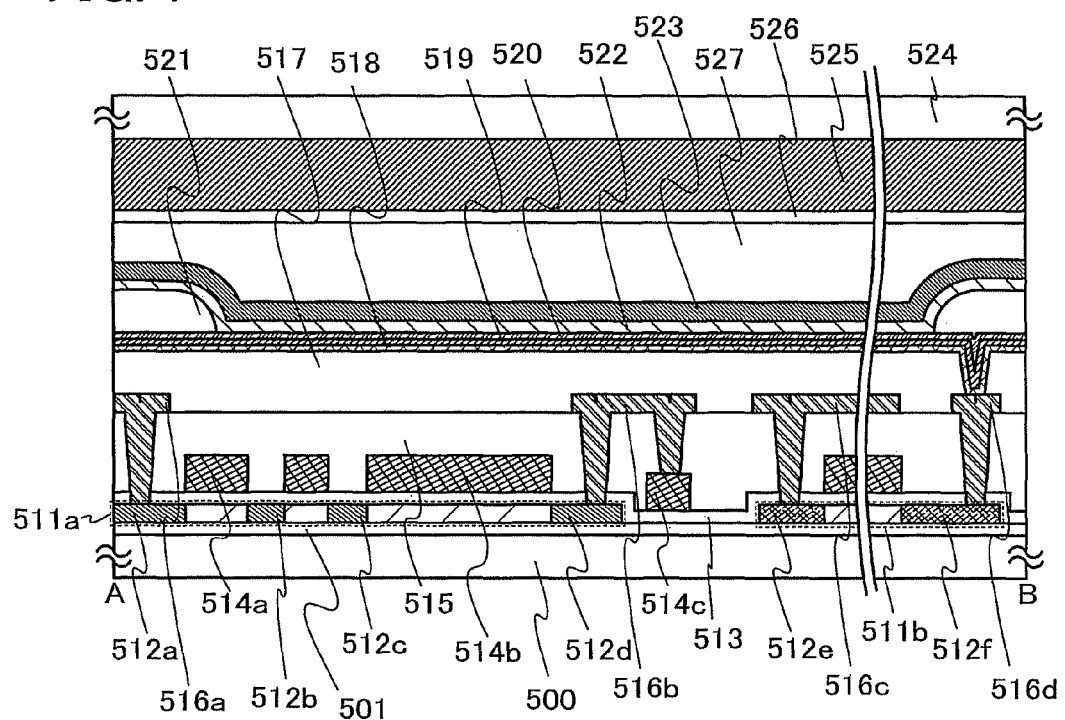
FIG. 7 is a schematic cross-sectional view of a structural example of a display device in Embodiment 3.

Further, a structural example of the display device of this embodiment will be described with reference to FIG. 7. FIG. 7 is a schematic cross-sectional view illustrating a structural example of the display device of this embodiment. Note that in this embodiment, a light-emitting element in the display device emits light in the direction of the top surface of the display device; however, this embodiment is not limited thereto. The display device of this embodiment may emit light in the direction of the bottom surface.

The display device illustrated in FIG. 7 includes an insulating layer 517, a conductive layer 518, a conductive layer 519, a conductive layer 520, an insulating layer 521, a light-emitting layer 522, a conductive layer 523, a substrate 524, a colored layer 525, an insulating layer 526, and an insulating layer 527 in addition to the active matrix substrate illustrated in FIGS. 6A and 6B.

The insulating layer 517 is provided over the insulating layer 515 with the conductive layers 516a to 516d provided therebetween.

The conductive layer 518 is provided over the insulating layer 517 of the display circuit and is electrically connected to the conductive layer 516d through a sixth opening in the insulating layer 517.

The conductive layer 519 is provided over the conductive layer 518. The conductive layer 519 is electrically connected to the conductive layer 518.

The conductive layer 520 is provided over the conductive layer 519. The conductive layer 520 is electrically connected to the conductive layer 519.

The conductive layers 518 to 520 correspond to an electrode layer of the light-emitting element described in the above embodiment. Note that the conductive layers 518 to 520 function as a first electrode of the light-emitting element of the display circuit.

The insulating layer 521 is provided over the conductive layer 518.

The light-emitting layer 522 is provided over the insulating layer 521 and is electrically connected to the conductive layer 518 through a seventh opening formed in the insulating layer 521. The light-emitting layer 522 functions as a light-emitting layer of the light-emitting element in the display circuit.

The conductive layer 523 is provided over and is electrically connected to the light-emitting layer 522. The conductive layer 523 corresponds to an electrode layer of the light-emitting element described in the above embodiment. The conductive layer 523 functions as a second electrode of the light-emitting element in the display circuit.

The colored layer 525 is provided over one surface of the substrate 524 and transmits light with a particular wavelength of light emitted from the light-emitting layer 522.

The insulating layer 526 is provided over the one surface of the substrate 524 with the colored layer 525 provided therebetween.

The insulating layer 527 is provided between the insulating layer 526 and the conductive layer 523.

The components of the device described with reference to FIGS. 6A and 6B and FIG. 7 will be described.

A glass substrate or a plastic substrate, for example, can be used for the substrates 500 and 524.

As the insulating layer 501, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. An oxide insulating layer such as a silicon oxide layer or a silicon oxynitride layer is preferably used as the insulating layer 501. In addition, the oxide insulating layer may contain halogen. The insulating layer 501 can be a stack of the aforementioned materials which can be used for the insulating layer 501. The insulating layer 501 is not necessarily provided.

The semiconductor layer 511a and 511b can be, for example, a layer containing an amorphous semiconductor, a microcrystalline semiconductor, a polycrystalline semiconductor, or a single crystal semiconductor. A semiconductor layer including a semiconductor belonging to Group 14 of the periodic table (e.g., silicon) can be used as the semiconductor layers 511a and 511b.

The insulating layer 513 can be a layer of a material which can be used for the insulating layer 501 or a layer of a resin material. The insulating, layer 513 can be a stack of materials which can be used for the insulating layer 513.

A layer formed using a metal such as molybdenum, titanium, chromium, tantalum, magnesium, silver, tungsten, aluminum, copper, neodymium, or scandium can be used for the conductive layers 514a to 514c. Alternatively, each of the conductive layers 514a to 514c can be, for example, a layer containing a conductive metal oxide. The conductive metal oxide can be a metal oxide such as indium oxide ($In_2O_3$), tin oxide ($SnO_2$), zinc oxide (ZnO), indium oxide-tin oxide ($In_2O_3$—$SnO_2$), or indium oxide-zinc oxide ($In_2O_3$—ZnO); or the aforementioned metal oxide containing silicon, silicon oxide, or nitrogen. The conductive layers 514a to 514c can also be a stack of the aforementioned materials which can be used for the conductive layers 514a to 514c. The conductive layers 514a to 514c can be a stack of a tantalum nitride layer and a tungsten layer, for example.

The insulating layer 515 can be a layer of a material which can be used for the insulating layer 501 or the insulating layer 513. The insulating layer 515 can be a stack of the aforementioned materials which can be used for the insulating layer 501. For example, the insulating layer 515 can be a stack of a silicon nitride oxide layer and a silicon oxynitride layer.

Each of the conductive layers 516a to 516d can be a layer of a material which can be used for the conductive layer 514a to 514c, for example. Each of the conductive layers 516a to 516d can be a stack of materials which can be used for the conductive layers 516a to 516d. For example, each of the conductive layers 516a to 516d can be a stack of a titanium layer, an aluminum layer, and a titanium layer. Note that side surfaces of each of the conductive layers 516a to 516d may be tapered.

The insulating layer 517 can be a layer of a material which can be used for the insulating layer 513 or the insulating layer 513, for example. The insulating layer 517 can be a stack of materials which can be used for the insulating layer 517.

The conductive layer 518 can be a layer of a material which can be used for the conductive layer 111 illustrated in FIG. 1B, for example.

The conductive layer 519 can be a layer of a material which can be used for the conductive layer 112 illustrated in FIG. 1B, for example.

The conductive layer 520 can be a layer of a material which can be used for the conductive layer 113 illustrated in FIG. 1B, for example.

The insulating layer 521 can be an organic insulating layer or an inorganic insulating layer, for example. Note that the insulating layer 521 is also referred to as a partition.

The light-emitting layer 522 can be a layer of a material (e.g., a light-emitting layer emitting white light) which can be used for the light-emitting layer described in the above embodiment.

The conductive layer 523 can be a layer of a light-transmitting material selected from the materials which can be used for the conductive layers 514a to 514. Alternatively, the conductive layer 523 can be a stack of materials which can be used for the conductive layer 523.

The colored layer 525 can be a layer which includes dye or pigment, for example, and which transmits light with the wavelength range of red, light with the wavelength range of green, and light with the wavelength range of blue. The colored layer 525 can be a layer which includes dye or pigment, for example, and which transmits light with the wavelength range of cyan, magenta, or yellow. The colored layer 525 is formed by the photolithography method, the printing method, the inkjet method, the printing method, the electrodeposition method, the electrophotographic method, or the like. By using the inkjet method, the colored layer can be manufactured at room temperature, manufactured at a low vacuum, or formed over a large substrate. Since the colored layer can be manufactured without a resist mask, manufacturing cost and the number of steps can be reduced.

The insulating layer 526 can be a layer of a material which can be used for the insulating layer 501 or the insulating layer 513. The insulating layer 526 can be a stack of materials which can be used for the insulating layer 526. Note that the insulating layer 526 is not necessarily provided, but providing the insulating layer 526 can suppress the entry of an impurity from the colored layer 525 to the light emitting element.

The insulating layer 527 can be a layer of a material which can be used for the insulating layer 501 or a layer of a resin material. The insulating layer 527 can be a stack of materials which can be used for the insulating layer 527.

As described with reference to FIG. 4, FIGS. 5A and 5B, FIGS. 6A and 6B, and FIG. 7, an example of the display device in this embodiment includes the signal-input selection transistor (first field-effect transistor) in which a display data signal is input to one of a source and a drain, the driving transistor (second field-effect transistor) whose gate is electrically connected to the other of the source and the drain of the first field-effect transistor, and a light-emitting element whose first electrode is electrically connected to one of a source and a drain of the second field-effect transistor and which has a structure described in the above embodiment.

An example of the display device in this embodiment includes a light-emitting element emitting white light and a colored layer which transmits light with a particular wavelength of light emitted from the light emitting element. This structure enables a full-color image to be displayed without forming plural kinds of light emitting elements emitting light of different colors, thereby facilitating the manufacturing process and enhancing yield. For example, a display element can be formed without a metal mask, and therefore, a manufacturing process can be simple. Further, contrast of an image can be improved. Further, the quality and reliability of a light-emitting element can be improved.

In the display device in this embodiment, a light-emitting element has a structure in which light is extracted through a substrate provided with no element such as a transistor, so that a region above a region provided with the element can be used as a light-emitting region; therefore, an aperture ratio can be improved.

In the display device in this embodiment, a driver circuit may be provided over the same substrate as the display circuit. In this case, the transistor in the circuit such as a driver circuit may have the same structure as the transistor in the display circuit. A circuit such as the driver circuit is provided over the same substrate as the display circuit, so that the number of connection wirings of the display circuit and the driver circuit can be reduced.

Embodiment 4

In this embodiment, examples of electronic devices each provided with the display device of the above embodiments will be described.

Structural examples of the electronic devices of this embodiment will be described with reference to FIGS. 8A to 8D. FIGS. 8A to 8D are schematic views each illustrating a structural example of the electronic device of this embodiment.

Figure 8A:
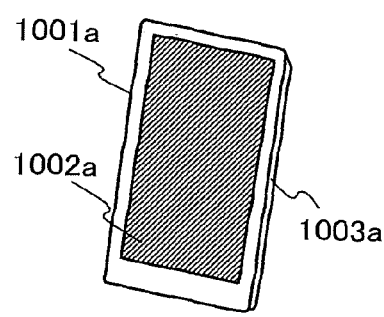
FIGS. 8A to 8D are schematic diagrams each illustrating an example of an electronic device in Embodiment 4.

An electronic device in FIG. 8A is an example of a mobile information terminal. The mobile information terminal in FIG. 8A includes a housing 1001a and a display portion 1002a provided in the housing 1001a.

Note that a side surface 1003a of the housing 1001a may be provided with a connection terminal for connecting the mobile information terminal to an external device and/or a button used to operate the mobile information terminal in FIG. 8A.

The mobile information terminal in FIG. 8A includes a CPU, a main memory, an interface transmitting/receiving a signal traveling between the external device and each of the CPU and the main memory, and an antenna transmitting/receiving a signal to/from the external device, in the housing 1001a. Note that in the housing 1001a, one or plural integrated circuits having a specific function may be provided.

The mobile information terminal in FIG. 8A functions, for example, as one or more devices selected from a telephone, an electronic book, a personal computer, and a game machine.

Figure 8C:
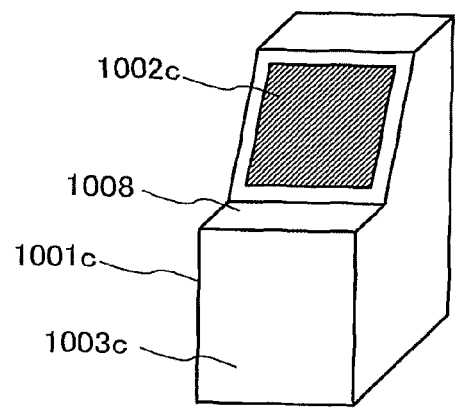
Figure 8B:
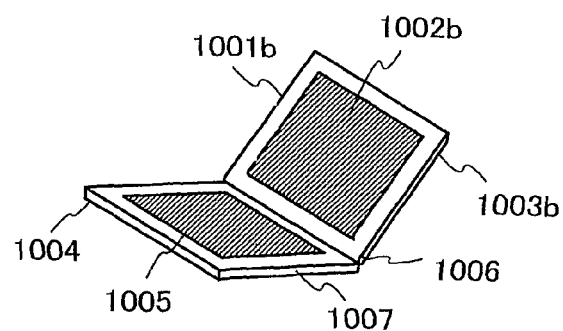

An electronic device in FIG. 8B is an example of a folding mobile information terminal. The mobile information terminal in FIG. 8B includes a housing 1001b, a display portion 1002b provided in the housing 1001b, a housing 1004, a display portion 1005 provided in the housing 1004, and a hinge 1006 for connecting the housing 1001b and the housing 1004.

In the mobile information terminal in FIG. 8B, the housing 1001b can be stacked on the housing 1004 by moving the housing 1001b or the housing 1004 with the hinge 1006.

Note that a side surface 1003b of the housing 1001b or a side surface 1007 of the housing 1004 may be provided with a connection terminal for connecting the mobile information terminal to an external device and/or a button used to operate the mobile information terminal in FIG. 8B.

The display portion 1002b and the display portion 1005 may display different images or one image. Note that the display portion 1005 is not necessarily provided; a keyboard which is an input device may be provided instead of the display portion 1005.

In the housing 1001b or the housing 1004 of the portable information terminal illustrated in FIG. 8B, a CPU, a main memory, and an interface transmitting/receiving a signal traveling between the external device and the CPU and the main memory are provided. Note that in the housing 1001b or the housing 1004, one or plural integrated circuits having a specific function may be provided. In addition, the mobile information terminal in FIG. 8B may include an antenna transmitting/receiving a signal to/from the external device.

The mobile information terminal in FIG. 8B functions, for example, as one or more devices selected from a telephone, an electronic book, a personal computer, and a game machine.

The electronic device in FIG. 8C is an example of a stationary information terminal. The stationary information terminal in FIG. 8C includes a housing 1001c and a display portion 1002c provided in the housing 1001c.

Note that the display portion 1002c can be provided on a deck portion 1008 of the housing 1001c.

The stationary information terminal in FIG. 8C includes a CPU, a main memory, and an interface transmitting/receiving a signal traveling between the external device and each of the CPU and the main memory, in the housing 1001c. Note that in the housing 1001c, one or plural integrated circuits having a specific function may be provided. In addition, the stationary information terminal in FIG. 8C may include an antenna transmitting/receiving a signal to/from the external device.

Further, a side surface 1003c of the housing 1001c in the stationary information terminal in FIG. 8C may be provided with one or more parts selected from a ticket ejection portion that ejects a ticket or the like, a coin slot, and a bill slot.

The stationary information terminal in FIG. 8C functions, for examples, as an automated teller machine, an information communication terminal for ticketing or the like (also referred to as a multi-media station), or a game machine.

Figure 8D:
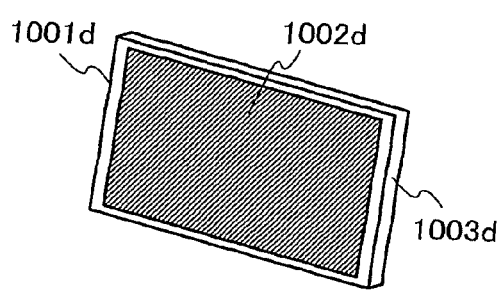

FIG. 8D illustrates an example of a stationary information terminal. The stationary information terminal in FIG. 8D includes a housing 1001d and a display portion 1002d provided in the housing 1001d. Note that a support for supporting the housing 1001d may also be provided.

Note that a side surface 1003d of the housing 1001d may be provided with a connection terminal for connecting the mobile information terminal to an external device and/or a button used to operate the mobile information terminal in FIG. 8D.

The stationary information terminal illustrated in FIG. 8D may also include, in the housing 1001d, a CPU, a main memory, and an interface transmitting/receiving a signal traveling between the external device and the CPU and the main memory. Further, in the housing 1001d, one or plural integrated circuits having a specific function may be provided. In addition, the stationary information terminal in FIG. 8D may include an antenna transmitting/receiving a signal to/from the external device.

The stationary information terminal illustrated in FIG. 8D functions, for example, as a digital photo frame, a display monitor, or a television set.

The display device described in the above embodiments is used for a display portion of an electronic device, and for example, used for the display portions 1002a to 1002d illustrated in FIGS. 8A to 8D. Further, the display device of the above embodiment may be used for the display portion 1005 illustrated in FIG. 8B. A light source part of the electronic device may be provided instead of the display device in the above embodiment, and a lighting device including the light-emitting element in the above embodiment may be provided for the light source part.

As described with reference to FIGS. 8A to 8D, in an example of the electronic device in this embodiment, the display device in the above embodiment is used for a display portion; therefore, power consumption can be reduced and reliability can be improved.

Further, in the example of the electronic device of this embodiment, the housing may be provided with one or more of a photoelectric conversion portion which generates current in accordance with incident illuminance and an operation portion for operating the display device. Providing a photoelectric transducer, for example, eliminates necessity of an external power source, allowing the above electronic device to be used for a long period of time even in a place without an external power source.

Embodiment 5

In this embodiment, examples of lighting devices including the light-emitting elements in the above embodiment will be described.

Examples of the lighting device in this embodiment will be described with reference to FIGS. 9A to 9D. FIGS. 9A to 9D are schematic views of the examples of the lighting devices in this embodiment.

Figure 9A:
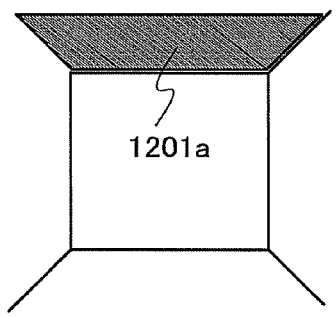
FIGS. 9A to 9D are diagrams each illustrating a structural example of a lighting device in Embodiment 5.

A lighting device 1201a illustrated in FIG. 9A is an example of a lighting device which can be attached to a ceiling of a room.

Figure 9B:
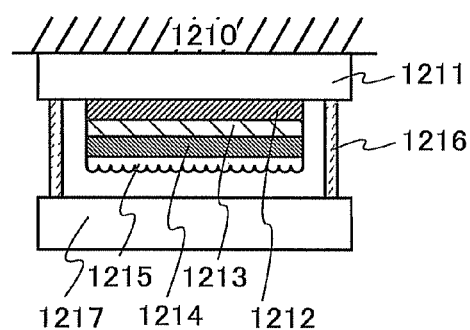

FIG. 9B illustrates a structural example the lighting device illustrated in FIG. 9A. The lighting device illustrated in FIG. 9B includes a base 1211 attached to a ceiling 1210; a stack of an electrode layer 1212, and a light-emitting layer 1213, an electrode layer 1214, which is provided over the base 1211; a lens 1215 provided over the electrode layer 1214; sealant 1216; and a base 1217 bonded to the base 1211 with the sealant 1216.

The base 1211 can be a substrate of aluminum oxide, duralumin, or magnesium oxide, for example. By using the substrate, heat can be easily released through the base 1211.

The electrode layer 1212 can be a layer of a material which can be used for the first electrode layer of the light-emitting element in the above embodiment, for example.

The light-emitting layer 1213 can be a layer of a material which can be used for the light-emitting layer of the light-emitting element in the above embodiment, for example.

The electrode layer 1214 can be a layer of a material which can be used for the second electrode layer of the light-emitting element in the above embodiment, for example.

The lens 1215 is formed of, for example, a material such as a resin. The lens 1215 has unevenness at the top surface, and preferably has hemispherical projections. With the lens 1215, light extraction efficiency can be enhanced.

The base 1217 can be a glass substrate, for example.

As described with reference to FIG. 9B, the lighting device 1201a illustrated in FIG. 9A includes a light-emitting portion provided with the light-emitting element in the above embodiment. The light-emitting portion may include desiccant. The lighting device 1201a may be provided with a control circuit configured to control light emission of the light-emitting element.

The lighting device illustrated in FIG. 9A is manufactured using the light-emitting element in any of the above embodiments, whereby the area of the lighting device can be easily increased.

Figure 9C:
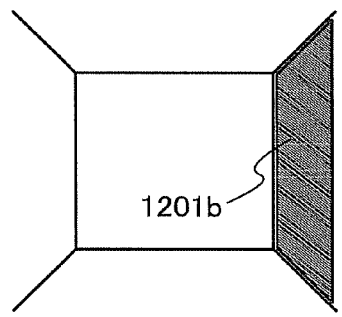

A lighting device 1201b illustrated in FIG. 9C is an example of a lighting device which can be attached to a sidewall of a room.

The lighting device 1201b includes the light-emitting element or the lighting device in the above embodiment, and a control circuit configured to control light emission of the light-emitting element.

The lighting device illustrated in FIG. 9C is manufactured using the light-emitting element in the above embodiment to the light-emitting portion, whereby the area of the lighting device can be easily increased. In addition, a light-transmitting glass substrate is used as a substrate of the lighting device 1201b, whereby the lighting device 1201b can be used as window glass.

Figure 9D:
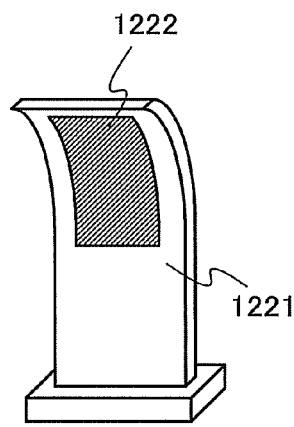

The lighting device illustrated in FIG. 9D is an example of a lighting device which can change the position of a light-emitting portion.

The lighting device illustrated in FIG. 9D includes a body 1221 and the light-emitting portion 1222.

The light-emitting portion 1222 can include the light-emitting element in the above embodiment.

Note that the body 1221 may be flexible. For example, a light-emitting element provided over a plastic substrate is used for the light-emitting portion, whereby the position of the light-emitting portion 1222 can be adjusted by bending the body back-and-forth.

As described with reference to FIGS. 9A to 9D, the lighting devices can be manufactured by providing the light-emitting element in any of the above embodiments in the light-emitting portions. A lighting device is manufactured by using the light-emitting element in any of the above embodiments in a light-emitting portion, whereby the power consumption of the lighting device can be reduced. Moreover, a lighting device is manufactured by using the light-emitting element in any of the above embodiments, whereby the light emission area of the lighting device can be easily increased.

Example 1

In this example, an example of a light-emitting element will be described.

As the light-emitting element in this example, light-emitting elements of a sample 1 (S1), a sample 2 (S2), and a sample 3 (S3) were manufactured.

The light-emitting elements of the samples 1 to 3 each included a lower electrode (also referred to as ED(DOWN)), a hole-injection layer (HIL), a hole-transport layer (HTL), an electroluminescence layer (ELL), an electron-transport layer (ETL), an electron-injection layer (EIL), and an upper electrode (also referred to as ED(UP)). Table 1 shows a specific structure (material (MT), thickness (TN), and the like) of each light-emitting element.

TABLE 1

| | | ED(DOWN) | | | HIL | HTL | ELL | | ETL | EIL | ED(UP) | |
|---|---|---|---|---|---|---|---|---|---|---|---|---|
| | | First | Second | Third | | | | | | | First | Second |
| S1 | Material (ratio) | Al—Ti | Ti | | NPB:MoOx (2:0.222) | NPB | CzPA:2DPAPA (1:0.1) | Alq | Bphen | LiF | AgMg (10:1) | ITO |
| | Thickness (nm) | 200 | 6 | | 195 | 10 | 30 | 10 | 20 | 1 | 10 | 70 |
| S2 | Material (ratio) | Al—Ti | Ti | ITO-SiOx | NPB:MoOx (2:0.222) | NPB | CzPA:2DPAPA (1:0.1) | Alq | BPhen | LiF | AgMg (10:1) | ITO |
| | Thickness (nm) | 200 | 6 | 50 | 130 | 10 | 30 | 10 | 20 | 1 | 10 | 70 |

TABLE 1-continued

| | | ED(DOWN) | | | | | | | | ED(UP) | |
|---|---|---|---|---|---|---|---|---|---|---|---|
| | | First | Second | Third | HIL | HTL | ELL | | ETL | EIL | First | Second |
| S3 | Material (ratio) | Al—Ti | Ti | ITO-SiOx | NPB:MoOx (2:0.222) | NPB | CzPA:2DPAPA (1:0.1) | Alq | BPhen | LiF | AgMg (10:1) | ITO |
| | Thickness (nm) | 200 | 6 | 100 | 65 | 10 | 30 | 10 | 20 | 1 | 10 | 70 |

A method for manufacturing the light-emitting elements of the samples 1 to 3 will be described.

First, the lower electrode (ED(DOWN)) was formed over a glass substrate.

Here, first, an alloy layer of aluminum and titanium (Al—Ti) was framed over the glass substrate by sputtering using a target in which aluminum content was 99 wt % and titanium content was 1 wt %. Over the alloy layer of aluminum and titanium, a titanium layer was formed by sputtering using a titanium target. Heat treatment was performed at 250° C. for 1 hour. After that, over the titanium layer, an indium oxide-tin oxide layer containing silicon oxide was formed by sputtering using a target in which $In_2O_3$ content was 85 wt %, $SnO_2$ content was 10 wt %, and $SiO_2$ content was 5 wt %. In the above manner, the lower electrode was formed.

Next, a composite layer of NPB and molybdenum oxide was formed at a ratio of NPB:MoOx=2:0.222 (wt/wt) by the co-evaporation method, so that the hole-injection layer was formed.

Next, a layer of NPB was formed by an evaporation method, so that the hole-transport layer was formed.

Next, a layer of CzPA and 2DPAPA was formed at CzPA:2DPAPA=1:0.1 (weight ratio) by the co-evaporation method, so that the electroluminescence layer was formed.

Next, a layer of Alq was formed by an evaporation method and a layer of Bphen was formed by an evaporation method, so that the electron-transport layer was formed.

Next, a layer of lithium fluoride was formed by an evaporation method, so that the electron-injection layer was formed.

Then, an alloy layer of magnesium and silver is formed at a ratio of Ag:Mg=10:1 (vol/vol) by the co-evaporation method and a layer of ITO is formed by sputtering using a target in which $In_2O_3$ content was 90 wt % and $SnO_2$ content was 10 wt %; in this manner, the upper electrode was formed.

The above is a manufacturing method of the light-emitting elements of the samples 1 to 3.

Figure 10:
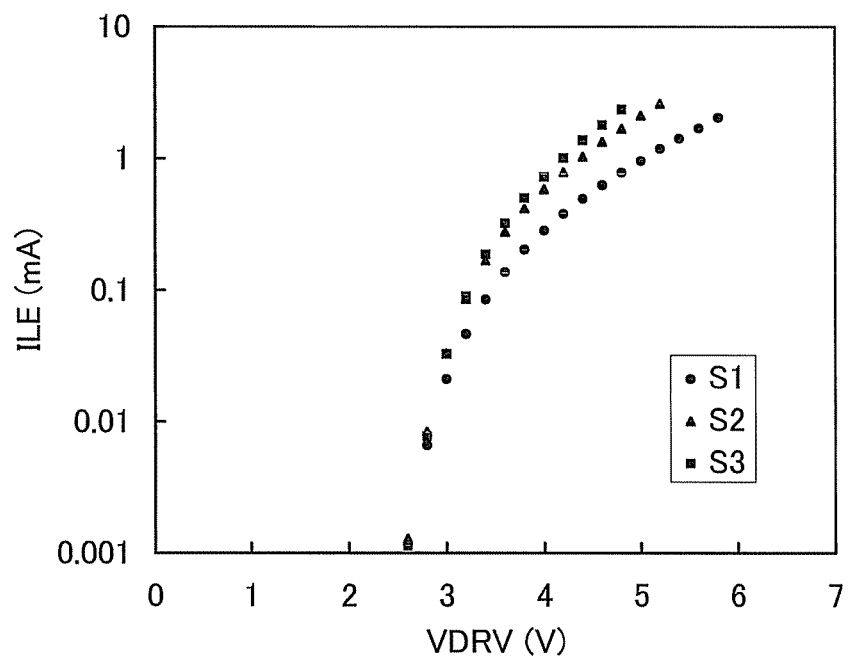
FIG. 10 is a graph showing current-voltage characteristics of light-emitting elements in Example 1.

Voltage was applied to the upper electrodes of the samples 1 (S1) to 3 (S3) and current flowing to the light-emitting element was measured. FIG. 10 shows a result of current (ILE)-voltage (VDRV) characteristics of the samples 1 (S1) to 3 (S3).

As shown in FIG. 10, compared to the sample 1 in which a conductive layer (MOL) including a metal oxide was not provided, the current amount of the samples 2 and 3 for which conductive layers (MOL) including a metal oxide were provided is large. Therefore, it can be found that voltage with respect to the predetermined current amount, that is, driving voltage can be lower by using a conductive layer containing a metal oxide.

This application is based on Japanese Patent Application serial no. 2011-027958 filed with Japan Patent Office on Feb. 11, 2011, the entire contents of which are hereby incorporated by reference.

What is claimed is:

1. A light-emitting element comprising:
a first electrode on a first insulating layer, the first electrode comprising a first conductive layer, a second conductive layer over and directly in contact with the first conductive layer, and a third conductive layer over and directly in contact with the second conductive layer;
a second insulating layer over and in contact with the third conductive layer, the second insulating layer comprising an opening portion which overlaps with the third conductive layer;
a hole-injection layer over and in contact with the third conductive layer and the second insulating layer, the hole-injection layer comprising an organic compound having a hole-transporting property and a metal oxide selected from vanadium oxide and molybdenum oxide;
a hole-transport layer over and in contact with the hole-injection layer;
an electroluminescent layer over and in contact with the hole-transport layer; and
a second electrode over the electroluminescent layer
wherein the electroluminescent layer overlaps with the first electrode;
wherein the first conductive layer is a metal alloy layer consisting essentially of aluminum and titanium,
wherein the second conductive layer is a metal layer consisting essentially of titanium,
wherein the third conductive layer comprises a metal oxide selected from indium oxide, tin oxide, zinc oxide, and indium oxide-tin oxide,
wherein the first conductive layer is in direct contact with the first insulating layer,
and wherein the second electrode is capable of transmitting light.

2. The light-emitting element according to claim 1, wherein the electroluminescent layer emits white light.

3. The light-emitting element according to claim 1, further comprising a colored layer over the second electrode.

4. An electronic device comprising the light-emitting element according to claim 1.

5. A lighting device comprising the light-emitting element according to claim 1.

6. The light-emitting element according to claim 1, wherein part of the second conductive layer is oxidized.

7. The light-emitting element according to claim 1, wherein the third conductive layer further comprises silicon.

8. The light-emitting element according to claim 1, wherein the first electrode is electrically connected to a source or a drain electrode of a transistor.

9. The light-emitting element according to claim 8, wherein the first insulating layer is over the source or the drain electrode.

10. A light-emitting element comprising:
a first electrode on a first insulating layer, the first electrode comprising a first conductive layer, a second conductive layer over and directly in contact with the first conductive layer, and a third conductive layer over and directly in contact with the second conductive layer;
a second insulating layer over and in contact with the third conductive layer, the second insulating layer comprising an opening portion which overlaps with the third conductive layer;
a hole-injection layer over and in contact with the third conductive layer and the second insulating layer, the hole-injection layer comprising an organic compound having a hole-transporting property and a metal oxide selected from vanadium oxide and molybdenum oxide;
a hole-transport layer over and in contact with the hole-injection layer;
an electroluminescent layer over and in contact with the hole-transport layer, the electroluminescent layer comprising a first light-emitting unit over the first electrode, a charge generation layer over the first light-emitting unit, and a second light-emitting unit over the charge generation layer; and
a second electrode over the electroluminescent layer,
wherein the electroluminescent layer overlaps with the first electrode;
wherein the first conductive layer is a metal alloy layer consisting essentially of aluminum and titanium,
wherein the second conductive layer is a metal layer consisting essentially of titanium,
wherein the third conductive layer comprises a metal oxide selected from indium oxide, tin oxide, zinc oxide, and indium oxide-tin oxide,
wherein the first conductive layer is in direct contact with the first insulating layer,
and wherein the second electrode is capable of transmitting light.

11. The light-emitting element according to claim 10, wherein the electroluminescent layer emits white light.

12. The light-emitting element according to claim 10, further comprising a colored layer over the second electrode.

13. The light-emitting element according to claim 10, wherein the charge generation layer comprises:
an electron-injection buffer layer comprising a material having an electron-transporting property higher than a hole-transporting property and an electron-donating property selected from an alkali metal, an alkaline earth metal, a compound of the alkali metal, and a compound of the alkaline earth metal; and
a composite material layer comprising a substance having a hole-transporting property and an acceptor substance.

14. An electronic device comprising the light-emitting element according to claim 10.

15. A lighting device comprising the light-emitting element according to claim 10.

16. The light-emitting element according to claim 10, wherein part of the second conductive layer is oxidized.

17. The light-emitting element according to claim 10, wherein the third conductive layer further comprises silicon.

18. The light-emitting element according to claim 10, wherein the first electrode is electrically connected to a source or a drain electrode of a transistor.

19. The light-emitting element according to claim 18, wherein the first insulating layer is over the source or the drain electrode.

20. A light-emitting element comprising:
a first electrode on a first insulating layer, the first electrode comprising a first conductive layer, a second conductive layer over and directly in contact with the first conductive layer, and a third conductive layer over and directly in contact with the second conductive layer;
a second insulating layer over and in contact with the third conductive layer, the second insulating layer comprising an opening portion which overlaps with the third conductive layer;
a hole-injection layer over and in contact with the third conductive layer and the second insulating layer, the hole-injection layer comprising an organic compound having a hole-transporting property and a metal oxide selected from vanadium oxide and molybdenum oxide;
a hole-transport layer over and in contact with the hole-injection layer;
an electroluminescent layer over and in contact with the hole-transport layer, the electroluminescent layer comprising a first light-emitting unit, a first charge generation layer over the first light-emitting unit, a second light-emitting unit over the first charge generation layer, a second charge generation layer over the second light-emitting unit, and a third light-emitting unit over the second charge generation layer; and
a second electrode over the electroluminescent layer,
wherein the electroluminescent layer overlaps with the first electrode;
wherein the first conductive layer is a metal alloy layer consisting essentially of aluminum and titanium,
wherein the second conductive layer is a metal layer consisting essentially of titanium,
wherein the third conductive layer comprises a metal oxide selected from indium oxide, tin oxide, zinc oxide, and indium oxide-tin oxide,
wherein the first conductive layer is in direct contact with the first insulating layer,
and wherein the second electrode is capable of transmitting light.

21. The light-emitting element according to claim 20, wherein the electroluminescent layer emits white light.

22. The light-emitting element according to claim 20, further comprising a colored layer over the second electrode.

23. The light-emitting element according to claim 20, wherein the first charge generation layer and the second charge generation layer comprise:
an electron-injection buffer layer comprising a material having an electron-transporting property higher than a hole-transporting property and an electron-donating property selected from an alkali metal, an alkaline earth metal, a compound of the alkali metal, and a compound of the alkaline earth metal; and
a composite material layer comprising a substance having a hole-transporting property and an acceptor substance.

24. An electronic device comprising the light-emitting element according to claim 20.

25. A lighting device comprising the light-emitting element according to claim 20.

26. The light-emitting element according to claim 20, wherein part of the second conductive layer is oxidized.

27. The light-emitting element according to claim 20, wherein the third conductive layer further comprises silicon.

28. The light-emitting element according to claim 20, wherein the first electrode is electrically connected to a source or a drain electrode of a transistor.

29. The light-emitting element according to claim 28, wherein the first insulating layer is over the source or the drain electrode.

\* \* \* \* \*

UNITED STATES PATENT AND TRADEMARK OFFICE
CERTIFICATE OF CORRECTION

PATENT NO. : 9,564,609 B2  Page 1 of 1
APPLICATION NO. : 13/369797
DATED : February 7, 2017
INVENTOR(S) : Toshiki Sasaki et al.

It is certified that error appears in the above-identified patent and that said Letters Patent is hereby corrected as shown below:

In the Specification

Column 1, Line 46; Change "loss, due" to --loss due--.
Column 6, Line 2; Change "to formed an" to --to form an--.
Column 7, Line 6; Change "N,N-" to --N,N'- --.
Column 8, Line 12; Change "[2-(2]" to --[2-(2']--.
Column 8, Line 50; Change "$BeBq_{12}$)," to --$BeBq_2$),--.
Column 9, Line 30; Change "(p-buty 1-phenyl)" to --(p-butylphenyl)--.
Column 9, Line 31; Change "polyp" to --poly(p--.
Column 9, Line 41; Change "(N,N-" to --(N,N'- --.
Column 9, Line 59; Change "4-[N-(3" to --4-[N'-(3--.
Column 9, Line 62; Change "3-[4N" to --3-[N--.
Column 10, Line 7; Change "N-bis" to --N'-bis--.
Column 13, Line 40; Change "for or the" to --for the--.
Column 19, Line 10; Change "insulating, layer" to --insulating layer--.
Column 25, Line 17; Change "framed" to --formed--.

In the Claims

Column 26, Line 34, Claim 1; Change "layer" to --layer,--.

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*